(12) United States Patent
Choi et al.

(10) Patent No.: US 9,112,156 B2
(45) Date of Patent: Aug. 18, 2015

(54) ELECTRON DONATING POLYMERS AND ORGANIC SOLAR CELLS INCLUDING THE SAME

(75) Inventors: Yeong Suk Choi, Suwon-si (KR); Soo-Ghang Ihn, Hwaseong-si (KR); Bulliard Xavier, Suwon-si (KR); Sung Young Yun, Suwon-si (KR); Youn Hee Lim, Seoul (KR); Yeon Ji Chung, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 448 days.

(21) Appl. No.: 13/293,756

(22) Filed: Nov. 10, 2011

(65) Prior Publication Data

US 2012/0279568 A1  Nov. 8, 2012

(30) Foreign Application Priority Data

May 4, 2011  (KR) .................. 10-2011-0042506

(51) Int. Cl.
*C08G 75/00* (2006.01)
*H01L 51/00* (2006.01)
*C08G 61/12* (2006.01)
*H01L 51/42* (2006.01)

(52) U.S. Cl.
CPC .......... *H01L 51/0036* (2013.01); *C08G 61/126* (2013.01); *C08G 2261/124* (2013.01); *C08G 2261/146* (2013.01); *C08G 2261/1412* (2013.01); *C08G 2261/1424* (2013.01); *C08G 2261/1426* (2013.01); *C08G 2261/3243* (2013.01); *C08G 2261/414* (2013.01); *C08G 2261/91* (2013.01); *H01L 51/0037* (2013.01); *H01L 51/0043* (2013.01); *H01L 51/4253* (2013.01); *Y02E 10/549* (2013.01)

(58) Field of Classification Search
CPC ............... C08G 2261/3243; C08G 61/126; H01L 51/0036
USPC .................................. 528/377, 380
See application file for complete search history.

(56) References Cited

U.S. PATENT DOCUMENTS

| 7,507,764 B2 | 3/2009 | Hirsch | |
|---|---|---|---|
| 2005/0143327 A1 | 6/2005 | Hirsch | |
| 2005/0209419 A1* | 9/2005 | Zahn et al. | 526/171 |
| 2008/0213324 A1 | 9/2008 | Zhou et al. | |
| 2011/0124822 A1* | 5/2011 | Yu et al. | 525/389 |

FOREIGN PATENT DOCUMENTS

| JP | 2005206750 | * 1/2004 | C08G 61/12 |
|---|---|---|---|
| KR | 10-0872957 B | 12/2008 | |

OTHER PUBLICATIONS

Liang et al. J. Am. Chem. Soc. 2009, 131, 56-57.*
Office Action dated Jul. 11, 2014 for corresponding U.S. Appl. No. 13/166,427.
Office Action for corresponding U.S. Appl. No. 13/166,427 dated Nov. 10, 2014.
M. C. Scharber et al. Adv. Mater, 18 789 2008 "Design Rules for Donors in Bulk-Heterojunction Solar Cells—Towards 10% Energy-Conversion Efficiency", 2006.

* cited by examiner

*Primary Examiner* — Shane Fang
(74) *Attorney, Agent, or Firm* — Harness, Dickey & Pierce, P.L.C.

(57) ABSTRACT

An electron-donating polymer may include a repeating unit A including a repeating unit according to Chemical Formula 3 and at least one selected from a repeating unit according to Chemical Formula 1, a repeating unit according to Chemical Formula 2, and a combination thereof, and a repeating unit B including a repeating unit according to Chemical Formula 4 and a repeating unit according to Chemical Formula 5.

17 Claims, 9 Drawing Sheets

ELECTRON DONATING POLYMERS AND ORGANIC SOLAR CELLS INCLUDING THE SAME

CROSS-REFERENCE TO RELATED APPLICATION

This application claims priority to and the benefit of Korean Patent Application No. 10-2011-0042506 filed in the Korean Intellectual Property Office on May 4, 2011, the entire contents of which are incorporated herein by reference.

BACKGROUND

1. Field

Example embodiments relate to electron-donating polymers and organic solar cells including the same.

2. Description of the Related Art

A solar cell is a photoelectric conversion device that transforms solar energy into electrical energy, and has attracted attention as an infinite but pollution-free next generation energy source.

A solar cell includes p-type and n-type semiconductors and produces electrical energy by transferring electrons and holes to the n-type and p-type semiconductors, respectively, and then collecting electrons and holes in each electrode when an electron-hole pair (EHP) is produced by solar light energy absorbed in a photoactive layer inside the semiconductors.

A solar cell may be classified into an inorganic solar cell and an organic solar cell depending on a material included in a thin layer. The organic solar cell may be classified into a bi-layer p-n junction structure in which a p-type semiconductor is formed in a separate layer from an n-type semiconductor, and a bulk heterojunction structure in which a p-type semiconductor is mixed with an n-type semiconductor.

SUMMARY

Example embodiments provide electron-donating polymers that are capable of absorbing light with a wider wavelength region and improving hole mobility, and having improved solubility in an organic solvent.

Example embodiments also provide organic solar cells that are capable of increasing a light absorption rate and short circuit current density ($J_{sc}$) as well as hole mobility, and resultantly improves efficiency.

According to example embodiments, an electron-donating polymer may include a repeating unit A including a repeating unit according to Chemical Formula 3 and at least one selected from a repeating unit according to Chemical Formula 1, a repeating unit according to Chemical Formula 2, and a combination thereof, and a repeating unit B including a repeating unit according to Chemical Formula 4 and a repeating unit according to Chemical Formula 5.

[Chemical Formula 1]

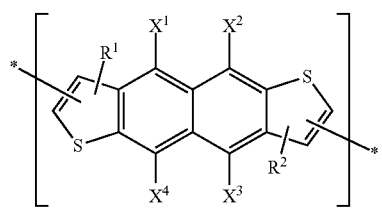

[Chemical Formula 2]

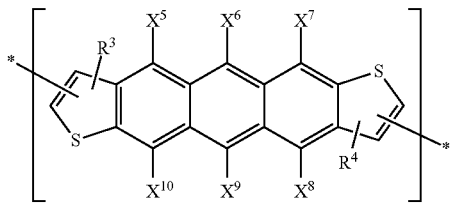

In Chemical Formulae 1 and 2, $X^1$ to $X^{10}$ are one of same and different, and each of $X^1$ to $X^{10}$ are independently one of hydrogen, a halogen, a substituted or unsubstituted $C_1$ to $C_{20}$ aliphatic organic group, a hydroxyl group, a substituted or unsubstituted $C_1$ to $C_{20}$ alkoxy group, a substituted or unsubstituted $C_1$ to $C_{20}$ ester group, a thiol group, or $-SR^{100}$, wherein $R^{100}$ is a substituted or unsubstituted $C_1$ to $C_{20}$ aliphatic organic group, a substituted or unsubstituted $C_2$ to $C_{30}$ aromatic organic group, and a substituted or unsubstituted $C_2$ to $C_{30}$ heterocycloalkyl group.

Specifically, $X^1$ to $X^4$ are one of same and different, and each $X^1$ to $X^4$ are independently one of hydrogen, a substituted or unsubstituted $C_1$ to $C_{20}$ alkyl group, a substituted or unsubstituted $C_1$ to $C_{20}$ alkoxy group, and a substituted or unsubstituted $C_1$ to $C_{20}$ ester group, provided that at least one of $X^1$ to $X^4$ is one of a substituted or unsubstituted $C_1$ to $C_{20}$ alkyl group, a substituted or unsubstituted $C_1$ to $C_{20}$ alkoxy group, and a substituted or unsubstituted $C_1$ to $C_{20}$ ester group, and $X^5$ to $X^{10}$ are one of same and different, and each $X^5$ to $X^{10}$ are independently one of hydrogen, a substituted or unsubstituted $C_1$ to $C_{20}$ alkyl group, a substituted or unsubstituted $C_1$ to $C_{20}$ alkoxy group, and a substituted or unsubstituted $C_1$ to $C_{20}$ ester group, provided that at least one of $X^5$ to $X^{10}$ is one of a substituted or unsubstituted $C_1$ to $C_{20}$ alkyl group, a substituted or unsubstituted $C_1$ to $C_{20}$ alkoxy group, and a substituted or unsubstituted $C_1$ to $C_{20}$ ester group.

More specifically, $X^1$ to $X^{10}$ are one of same and different, and each of $X^1$ to $X^{10}$ are independently one of hydrogen and a substituted or unsubstituted $C_1$ to $C_{20}$ alkoxy group, provided that at least one of $X^1$ to $X^4$ is a substituted or unsubstituted $C_1$ to $C_{20}$ alkoxy group, and at least one of $X^5$ to $X^{10}$ is a substituted or unsubstituted $C_1$ to $C_{20}$ alkoxy group.

$R^1$ to $R^4$ are one of same and different, and each of $R^1$ to $R^4$ are independently one of hydrogen, a substituted or unsubstituted $C_1$ to $C_{20}$ linear or branched alkyl group, a substituted or unsubstituted $C_3$ to $C_{20}$ cycloalkyl group, a substituted or unsubstituted $C_1$ to $C_{20}$ alkoxy group, a substituted or unsubstituted $C_6$ to $C_{30}$ aryl group, a substituted or unsubstituted $C_2$ to $C_{30}$ heteroaryl group, and a combination thereof, or optionally at least one of $CH_2$ groups of $R^1$ to $R^4$ is substituted with $-O-$, $-S-$, $-SO_2-$, $-CO-$, $-OCO-$, $-COO-$, $-CH=CH-$, $C-$, or $-SiR^{101}R^{102}-$, wherein $R^{101}$ and $R^{102}$ are one of same and different, and each of $R^{101}$ and $R^{102}$ are independently one of hydrogen, a substituted or unsubstituted $C_1$ to $C_{20}$ linear or branched alkyl group, a substituted or unsubstituted $C_3$ to $C_{20}$ cycloalkyl group, a substituted or unsubstituted $C_1$ to $C_{20}$ alkoxy group, a substituted or unsubstituted $C_6$ to $C_{30}$ aryl group, a substituted or unsubstituted $C_2$ to $C_{33}$ heteroaryl group, and a combination thereof.

Specifically, $R^1$ to $R^4$ are one of same and different, and each of $R^1$ to $R^4$ are independently one of hydrogen and a substituted or unsubstituted $C_1$ to $C_{20}$ alkyl group. More specifically, $R^1$ to $R^4$ are hydrogen.

[Chemical Formula 3]

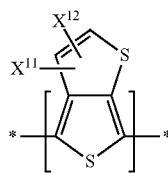

In Chemical Formula 3, $X^{11}$ and $X^{12}$ are one of same or different, and each of $X^{11}$ and $X^{12}$ are independently one of hydrogen, a halogen, a substituted or unsubstituted $C_1$ to $C_{20}$ aliphatic organic group, a hydroxyl group, a substituted or unsubstituted $C_1$ to $C_{20}$ alkoxy group, a substituted or unsubstituted $C_1$ to $C_{20}$ ester group, a thiol group, or —$SR^{103}$, wherein $8^{103}$ is a substituted or unsubstituted $C_1$ to $C_{20}$ aliphatic organic group, a substituted or unsubstituted $C_2$ to $C_{30}$ aromatic organic group, and a substituted or unsubstituted $C_2$ to $C_{30}$ heterocycloalkyl group.

Specifically, the repeating unit according to Chemical Formula 3 may include at least one selected from a repeating unit according to Chemical Formula 3-1, a repeating unit according to Chemical Formula 3-2, and a combination thereof.

[Chemical Formula 3-1]

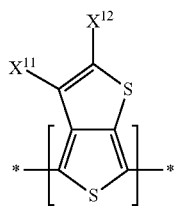

[Chemical Formula 3-2]

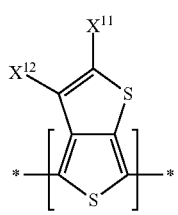

In Chemical Formulae 3-1 and 3-2, each $X^{11}$ are one of same and different in each repeating unit, and each $X^{11}$ are independently one of hydrogen and a halogen, and each $X^{12}$ are one of same and different in each repeating unit, and each $X^{12}$ are independently one of a substituted or unsubstituted $C_1$ to $C_{20}$ alkyl group, a substituted or unsubstituted $C_1$ to $C_{20}$ alkoxy group, and a substituted or unsubstituted $C_1$ to $C_{20}$ ester group.

Specifically, each $X^{11}$ are one of same and different in each repeating unit, and each $X^{11}$ are independently one of hydrogen and a halogen, and each $X^{12}$ are one of same and different in each repeating unit, and each $X^{12}$ are independently a substituted or unsubstituted $C_1$ to $C_{20}$ ester group.

[Chemical Formula 4]

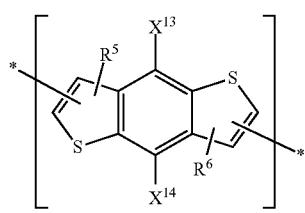

In Chemical Formula 4, $X^{13}$ and $X^{14}$ are one of same and different, and each one of $X^{13}$ and $X^{14}$ are independently one of hydrogen, a halogen, a substituted or unsubstituted $C_1$ to $C_{20}$ aliphatic organic group, a hydroxyl group, a substituted or unsubstituted $C_1$ to $C_{20}$ alkoxy group, a substituted or unsubstituted $C_1$ to $C_{20}$ ester group, a thiol group, and —$SR^{104}$, wherein $R^{104}$ is one of a substituted or unsubstituted $C_1$ to $C_{20}$ aliphatic organic group, a substituted or unsubstituted $C_2$ to $C_{30}$ aromatic organic group, and a substituted or unsubstituted $C_2$ to $C_{30}$ heterocycloalkyl group.

Specifically, $X^{13}$ and $X^{14}$ are one of same and different, and each of $X^{13}$ and $X^{14}$ are independently one of a substituted or unsubstituted $C_1$ to $C_{20}$ alkyl group, a substituted or unsubstituted $C_1$ to $C_{20}$ alkoxy group, a substituted or unsubstituted $C_1$ to $C_{20}$ ester group, and —$SR^{104}$, wherein $R^{104}$ is a substituted or unsubstituted $C_1$ to $C_{20}$ alkyl group. More specifically, $X^{13}$ and $X^{14}$ are one of same and different, and each $X^{13}$ and $X^{14}$ are independently a substituted or unsubstituted $C_1$ to $C_{20}$ alkoxy group.

$R^5$ and $R^6$ are one of same and different, and each of $R^5$ and $R^6$ are independently one of hydrogen, a substituted or unsubstituted $C_1$ to $C_{20}$ linear or branched alkyl group, a substituted or unsubstituted $C_3$ to $C_{20}$ cycloalkyl group, a substituted or unsubstituted $C_1$ to $C_{20}$ alkoxy group, a substituted or unsubstituted $C_6$ to $C_{30}$ aryl group, a substituted or unsubstituted $C_2$ to $C_{30}$ heteroaryl group, and a combination thereof, or optionally at least one of $CH_2$ groups of $R^5$ and $R^6$ is substituted with one of —O—, —S—, —$SO_2$—, —CO—, —OCO—, —COO—, —CH=CH—, —C≡C—, and —$SiR^{105}R^{106}$—, wherein $R^{105}$ and $R^{106}$ are one of same and different, and each of $R^{105}$ and $R^{106}$ are independently one of hydrogen, a substituted or unsubstituted $C_1$ to $C_{20}$ linear or branched alkyl group, a substituted or unsubstituted $C_3$ to $C_{20}$ cycloalkyl group, a substituted or unsubstituted $C_1$ to $C_{20}$ alkoxy group, a substituted or unsubstituted $C_6$ to $C_{30}$ aryl group, a substituted or unsubstituted $C_2$ to $C_{30}$ heteroaryl group, and a combination thereof.

Specifically, $R^5$ and $R^6$ are one of same and different, and each of $R^5$ and $R^6$ are independently one of hydrogen and a substituted or unsubstituted $C_1$ to $C_{20}$ alkyl group. More specifically, $R^5$ and $R^6$ may be hydrogen.

[Chemical Formula 5]

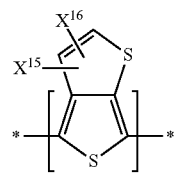

In Chemical Formula 5, $X^{15}$ and $X^{16}$ are one of same and different, and each of $X^{15}$ and $X^{16}$ are independently one of hydrogen, a halogen, a substituted or unsubstituted $C_1$ to $C_{20}$ aliphatic organic group, a hydroxyl group, a substituted or unsubstituted $C_1$ to $C_{20}$ alkoxy group, a substituted or unsubstituted $C_1$ to $C_{20}$ ester group, a thiol group, and —$SR^{107}$, wherein $R^{107}$ is one of a substituted or unsubstituted $C_1$ to $C_{20}$ aliphatic organic group, a substituted or unsubstituted $C_2$ to $C_{30}$ aromatic organic group, and a substituted or unsubstituted $C_2$ to $C_{30}$ heterocycloalkyl group.

Specifically, the repeating unit according to Chemical Formula 5 may include at least one selected from a repeating unit according to Chemical Formula 5-1, a repeating unit according to Chemical Formula 5-2, and a combination thereof.

[Chemical Formula 5-1]

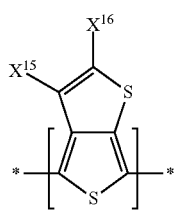

[Chemical Formula 5-2]

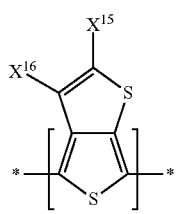

In Chemical Formulae 5-1 and 5-2, each $X^{15}$ are one of same and different in each repeating unit, and each $X^{15}$ are independently one of hydrogen and a halogen, each $X^{16}$ are one of same and different in each repeating unit, and each $X^{16}$ are independently one of a substituted or unsubstituted $C_1$ to $C_{20}$ alkyl group, a substituted or unsubstituted $C_1$ to $C_{20}$ alkoxy group, and a substituted or unsubstituted $C_1$ to $C_{20}$ ester group.

Specifically, each $X^{15}$ are one of same and different in each repeating unit, and each $X^{15}$ are independently one of hydrogen and a halogen, and each $X^{16}$ are one of same and different in each repeating unit, and each $X^{16}$ are independently a substituted or unsubstituted $C_1$ to $C_{20}$ ester group.

Specifically, the repeating unit A may include a repeating unit according to Chemical Formula 11.

[Chemical Formula 11]

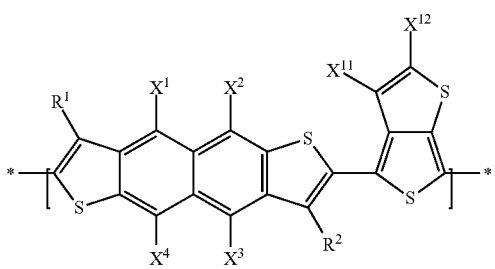

In Chemical Formula 11, $X^1$ to $X^4$ are one of same and different, and each of $X^1$ to $X^4$ are independently one of hydrogen, a substituted or unsubstituted $C_1$ to $C_{20}$ alkyl group, a substituted or unsubstituted $C_1$ to $C_{20}$ alkoxy group, and a substituted or unsubstituted $C_1$ to $C_{20}$ ester group, provided that at least one of $X^1$ to $X^4$ is one of a substituted or unsubstituted $C_1$ to $C_{20}$ alkyl group, a substituted or unsubstituted $C_1$ to $C_{20}$ alkoxy group, and a substituted or unsubstituted $C_1$ to $C_{20}$ ester group, each $X^{11}$ are one of same and different in each repeating unit, and each $X^{11}$ are independently one of hydrogen and a halogen, each $X^{12}$ are one of same and different in each repeating unit, and each $X^{12}$ are independently a substituted or unsubstituted $C_1$ to $C_{20}$ alkyl group, a substituted or unsubstituted $C_1$ to $C_{20}$ alkoxy group, and a substituted or unsubstituted $C_1$ to $C_{20}$ ester group, and $R^1$ and $R^2$ are one of same and different, and each of $R^1$ and $R^2$ are independently one of hydrogen and a substituted or unsubstituted $C_1$ to $C_{20}$ alkyl group.

Specifically, $X^1$ to $X^4$ are one of same and different, and each of $X^1$ to $X^4$ are independently one of hydrogen and a substituted or unsubstituted $C_1$ to $C_{20}$ alkoxy group, at least one of $X^1$ to $X^4$ is a substituted or unsubstituted $C_1$ to $C_{20}$ alkoxy group, $R^1$ and $R^2$ are hydrogen, each $X^{11}$ are one of same and different in each repeating unit, and each $X^{11}$ are independently one of hydrogen and a halogen, and each $X^{12}$ are one of same and different in each repeating unit, and each $X^{12}$ are independently a substituted or unsubstituted $C_1$ to $C_{20}$ ester group.

Specifically, the repeating unit A may include a repeating unit according to Chemical Formula 13.

[Chemical Formula 13]

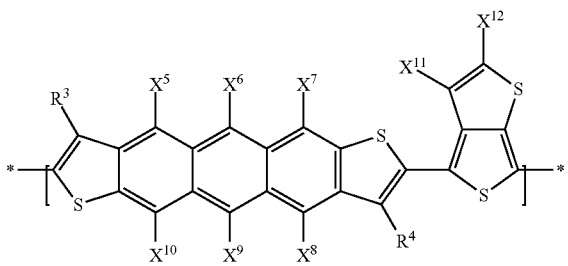

In Chemical Formula 13, $X^5$ to $X^{10}$ are one of same and different, and each $X^5$ to $X^{10}$ are independently one of hydrogen, a substituted or unsubstituted $C_1$ to $C_{20}$ alkyl group, a substituted or unsubstituted $C_1$ to $C_{20}$ alkoxy group, and a substituted or unsubstituted $C_1$ to $C_{20}$ ester group, provided that at least one of $X^5$ to $X^{10}$ is one of a substituted or unsubstituted $C_1$ to $C_{20}$ alkyl group, a substituted or unsubstituted $C_1$ to $C_{20}$ alkoxy group, and a substituted or unsubstituted $C_1$ to $C_{20}$ ester group, each $X^{11}$ are one of same and different in each repeating unit, and each $X^{11}$ are independently one of hydrogen and a halogen, each $X^{12}$ are one of same and different in each repeating unit, and each $X^{12}$ are independently one of a substituted or unsubstituted $C_1$ to $C_{20}$ alkyl group, a substituted or unsubstituted $C_1$ to $C_{20}$ alkoxy group, and a substituted or unsubstituted $C_1$ to $C_{20}$ ester group, and $R^3$ and $R^4$ are one of same and different, and each $R^3$ and $R^4$ are independently one of hydrogen and a substituted or unsubstituted $C_1$ to $C_{20}$ alkyl group.

Specifically, $X^5$ to $X^{10}$ are one of same and different, and each $X^5$ to $X^{10}$ are independently one of hydrogen and a substituted or unsubstituted $C_1$ to $C_{20}$ alkoxy group, at least one of $X^5$ to $X^{10}$ is a substituted or unsubstituted $C_1$ to $C_{20}$ alkoxy group, $R^3$ and $R^4$ are hydrogen, each $X^{11}$ are one of same and different in each repeating unit, and each $X^{11}$ are independently one of hydrogen and a halogen, and each $X^{12}$ are one of same and different in each repeating unit, and each $X^{12}$ are independently a substituted or unsubstituted $C_1$ to $C_{20}$ ester group.

Specifically, the repeating unit B may include a repeating unit according to Chemical Formula 12.

[Chemical Formula 12]

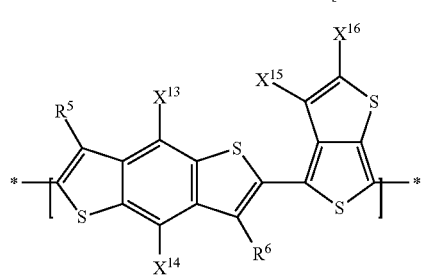

In Chemical Formula 12, $X^{13}$ and $X^{14}$ are one of same and different, and each of $X^{13}$ and $X^{14}$ are independently one of a substituted or unsubstituted $C_1$ to $C_{20}$ alkyl group, a substituted or unsubstituted $C_1$ to $C_{20}$ alkoxy group, a substituted or unsubstituted $C_1$ to $C_{20}$ ester group, and —$SR^{104}$, wherein $R^{104}$ is a substituted or unsubstituted $C_1$ to $C_{20}$ alkyl group, each $X^{15}$ are one of same and different in each repeating unit, and each $X^{15}$ are independently one of hydrogen and a halogen, each $X^{16}$ are one of same and different in each repeating unit, and each $X^{16}$ are independently a substituted or unsubstituted $C_1$ to $C_{20}$ alkyl group, a substituted or unsubstituted $C_1$ to $C_{20}$ alkoxy group, and a substituted or unsubstituted $C_1$ to $C_{20}$ ester group, and $R^5$ and $R^6$ are one of same and different, and each of $R^5$ and $R^6$ are independently one of hydrogen and a substituted or unsubstituted $C_1$ to $C_{20}$ alkyl group.

Specifically, $X^{13}$ and $X^{14}$ are one of same and different, and each $X^{13}$ and $X^{14}$ are independently a substituted or unsubstituted $C_1$ to $C_{20}$ alkoxy group, $R^5$ and $R^6$ are hydrogen, each $X^{15}$ are one of same and different, and each $X^{15}$ are independently one of hydrogen and a halogen, and each $X^{16}$ are one of same and different, and each $X^{16}$ are independently a substituted or unsubstituted $C_1$ to $C_{20}$ ester group.

In the electron-donating polymer, the repeating unit A may have a bandgap ranging from about 1.1 eV to about 2.5 eV. In the electron-donating polymer, the repeating unit B may have hole mobility ranging from about $1\times10^{-6}$ cm$^2$/V·s to about $9\times10^{-1}$ cm$^2$/V·s. The electron-donating polymer may include the repeating unit A and the repeating unit B at a mole ratio of about 1:10 to about 10:1.

The electron-donating polymer may have a number average molecular weight of about 1000 to about 800,000. The electron-donating polymer may have a bandgap ranging from about 1.1 eV to about 2.5 eV. The electron-donating polymer may have hole mobility ranging from about $1\times10^{-6}$ cm$^2$/V·s to about $9\times10^{-1}$ cm$^2$/V·s.

According to example embodiments, an organic solar cell may include an anode and a cathode configured to face each other, and a photoactive layer between the anode and the cathode and including an electron donor including the electron-donating polymer and an electron acceptor.

Further example embodiments are described in the following detailed description.

BRIEF DESCRIPTION OF THE DRAWINGS

These and/or other aspects will become apparent and more readily appreciated from the following description of example embodiments, taken in conjunction with the accompanying drawings of which.

DETAILED DESCRIPTION

Figure 1:
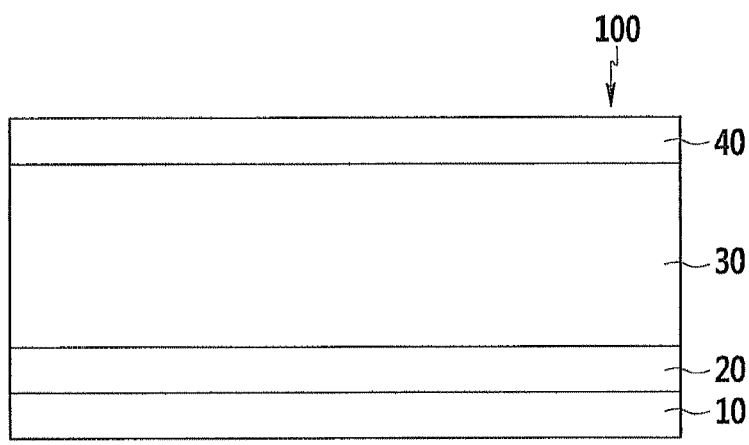
FIG. 1 is a cross-sectional view showing an organic solar cell according to example embodiments.

Example embodiments will hereinafter be described in further detail with reference to the accompanying drawings, in which various embodiments are shown. This disclosure may, however, be embodied in many different forms and should not be construed as limited to example embodiments set forth herein.

As used herein, when a specific definition is not otherwise provided, the term "substituted" refers to one substituted with at least one substituent including a halogen (—F, —Cl, —Br, or —I), a hydroxy group, a nitro group, a cyano group, an amino group ($NH_2$, $NH(R^{200})$, or $N(R^{201})(R^{202})$, wherein $R^{200}$, $R^{201}$, and $R^{202}$ are one of same and different, and each of $R^{200}$, $R^{201}$, and $R^{202}$ are independently a $C_1$ to $C_{10}$ alkyl group), an amidino group, a hydrazine group, a hydrazone group, a carboxyl group, a substituted or unsubstituted alkyl group, a substituted or unsubstituted haloalkyl group, a substituted or unsubstituted alkoxy group, a substituted or unsubstituted alkenyl group, a substituted or unsubstituted alkynyl group, a substituted or unsubstituted aryl group, a substituted or unsubstituted heteroaryl group, and a substituted or unsubstituted heterocycloalkyl group in place of at least one hydrogen of a functional group.

As used herein, when a specific definition is not otherwise provided, the term "aliphatic" may refer to $C_1$ to $C_{20}$ alkyl, a $C_2$ to $C_{20}$ alkenyl, a $C_2$ to $C_{20}$ alkynyl, a $C_1$ to $C_{20}$ alkylene, a $C_2$ to $C_{20}$ alkenylene, or a $C_2$ to $C_{20}$ alkynylene, and specifically a $C_1$ to $C_{15}$ alkyl, a $C_2$ to $C_{15}$ alkenyl, a $C_2$ to $C_{15}$ alkynyl, a $C_1$ to $C_{15}$ alkylene, a $C_2$ to $C_{15}$ alkenylene, or a $C_2$ to $C_{15}$ alkynylene, and more specifically a $C_1$ to $C_{10}$ alkyl, a $C_2$ to $C_{10}$ alkenyl, a $C_2$ to $C_{10}$ alkynyl, a $C_1$ to $C_{10}$ alkylene, a $C_2$ to $C_{10}$ alkenylene, or a $C_2$ to $C_{10}$ alkynylene, and the term "aromatic" may refer to a $C_6$ to $C_{30}$ aryl, a $C_2$ to $C_{30}$ heteroaryl, a $C_6$ to $C_{30}$ arylene, or a $C_2$ to $C_{30}$ heteroarylene, and specifically a $C_6$ to $C_{20}$ aryl, a $C_2$ to $C_{20}$ heteroaryl, a $C_6$ to $C_{20}$ arylene, or a $C_2$ to $C_{20}$ heteroarylene.

As used herein, when a specific definition is not otherwise provided, the terms "heterocycloalkyl group", "heteroaryl group", and "heteroarylene group" may independently refer to a cycloalkyl group, an aryl group, and an arylene group including at least one heteroatom of N, O, S, Si, or P and remaining carbon in one cycle.

As used herein, when a specific definition is not otherwise provided, the term "alkyl group" may refer to a $C_1$ to $C_{20}$ alkyl group, specifically, a $C_1$ to $C_{15}$ alkyl group, and more specifically a $C_1$ to $C_{10}$ alkyl group, the term "cycloalkyl group" may refer to a $C_3$ to $C_{20}$ cycloalkyl group, specifically a $C_3$ to $C_{15}$ cycloalkyl group, and more specifically a $C_3$ to $C_{10}$ cycloalkyl group, the term "alkylene group" may refer to a $C_1$ to $C_{20}$ alkylene group, specifically a $C_1$ to $C_{15}$ alkylene group, and more specifically a $C_1$ to $C_{10}$ alkylene group, the term "alkenyl group" may refer to a $C_2$ to $C_{20}$ alkenyl group, specifically a $C_2$ to $C_{15}$ alkenyl group, and more specifically a $C_2$ to $C_{10}$ alkenyl group, the term "alkenylene group" may refer to a $C_2$ to $C_{20}$ alkenylene group, specifically a $C_2$ to $C_{15}$ alkenylene group, and more specifically a $C_2$ to $C_{10}$ alkenylene group, the term "alkynyl group" may refer to a $C_2$ to $C_{20}$ alkynyl group, specifically a $C_2$ to $C_{15}$ alkynyl group, and more specifically a $C_2$ to $C_{10}$ alkynyl group, the term "alkynylene group" may refer to a $C_2$ to $C_{20}$ alkynylene group, specifically a $C_2$ to $C_{15}$ alkynylene group, and more specifically a $C_2$ to $C_{10}$ alkynylene group, the term "alkoxy group" may refer to a $C_1$ to $C_{20}$ alkoxy group, specifically a $C_1$ to $C_{15}$ alkoxy group, and more specifically a $C_1$ to $C_{10}$ alkoxy group, the term "ester group" may refer to a $C_1$ to $C_{20}$ ester group, specifically a $C_1$ to $C_{15}$ ester group, and more specifically a $C_1$ to $C_{10}$ ester group, the term "aryl group" may refer to a $C_6$ to $C_{30}$ aryl group, specifically a $C_6$ to $C_{20}$ aryl group, and more specifically a $C_6$ to $C_{15}$ an aryl group, the term "heterocycloalkyl group" may refer to a $C_2$ to $C_{10}$ heterocycloalkyl group, specifically a $C_2$ to $C_{20}$ heterocycloalkyl group, and the term "halogen" refers to F, Cl, Br, or I.

As used herein, when a definition is not otherwise provided, the term "combination" commonly refers to mixing or copolymerization. Herein, the term "copolymerization" refers to block copolymerization, random copolymerization, or graft copolymerization, and the term "copolymer" may refer to a block copolymer, a random copolymer, or a graft copolymer.

In addition, in the specification, the symbol "*" may refer to an attachment point to one of same and different atom or chemical formula.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

According to example embodiments, an electron-donating polymer includes a repeating unit A including a repeating unit according to Chemical Formula 3 and at least one selected from a repeating unit according to Chemical Formula 1, a repeating unit according to Chemical Formula 2, and a combination thereof, and a repeating unit B including a repeating unit according to Chemical Formula 4 and a repeating unit according to Chemical Formula 5.

[Chemical Formula 1]

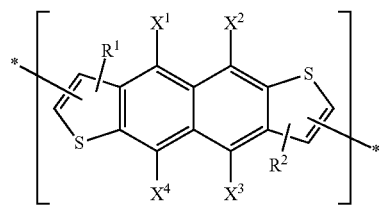

[Chemical Formula 2]

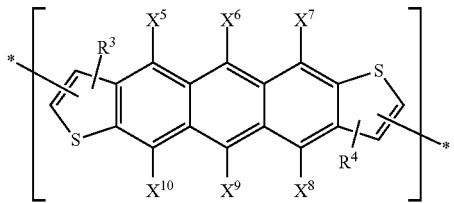

In Chemical Formulae 1 and 2, $X^1$ to $X^{10}$ are one of same and different, and each $X^1$ to $X^{10}$ are independently one of hydrogen, a halogen, a substituted or unsubstituted $C_1$ to $C_{20}$ aliphatic organic group, a hydroxyl group, a substituted or unsubstituted $C_1$ to $C_{20}$ alkoxy group, a substituted or unsubstituted $C_1$ to $C_{20}$ ester group, a thiol group, and $-SR^{100}$.

Herein, $R^{100}$ is one of a substituted or unsubstituted $C_1$ to $C_{20}$ aliphatic organic group, a substituted or unsubstituted $C_2$ to $C_{30}$ aromatic organic group, and a substituted or unsubstituted $C_2$ to $C_{30}$ heterocycloalkyl group, and is specifically a substituted or unsubstituted $C_1$ to $C_{20}$ alkyl group. When $X^1$ to $X^{10}$ include an alkenyl group or an alkynyl group, $X^1$ to $X^{10}$ include one or two carbon-carbon unsaturated bonds, for example a carbon-carbon double bond and a carbon-carbon triple bond.

Specifically, $X^1$ to $X^4$ are one of same and different, and each $X^1$ to $X^4$ are independently one of hydrogen, a substituted or unsubstituted $C_1$ to $C_{20}$ alkyl group, a substituted or unsubstituted $C_1$ to $C_{20}$ alkoxy group, and a substituted or unsubstituted $C_1$ to $C_{20}$ ester group, provided that at least one of $X^1$ to $X^4$ is one of a substituted or unsubstituted $C_1$ to $C_{20}$ alkyl group, a substituted or unsubstituted $C_1$ to $C_{20}$ alkoxy group, and a substituted or unsubstituted $C_1$ to $C_{20}$ ester group, and $X^5$ to $X^{10}$ are one of same and different, and each $X^5$ to $X^{10}$ are independently one of hydrogen, a substituted or unsubstituted $C_1$ to $C_{20}$ alkyl group, a substituted or unsubstituted $C_1$ to $C_{20}$ alkoxy group, and a substituted or unsubstituted $C_1$ to $C_{20}$ ester group, provided that at least one of $X^5$ to $X^{10}$ is one of a substituted or unsubstituted $C_1$ to $C_{20}$ alkyl group, a substituted or unsubstituted $C_1$ to $C_{20}$ alkoxy group, and a substituted or unsubstituted $C_1$ to $C_{20}$ ester group.

More specifically, $X^1$ to $X^{10}$ are one of same and different, and each $X^1$ to $X^{10}$ are independently hydrogen or a substituted or unsubstituted $C_1$ to $C_{20}$ alkoxy group, at least one of $X^1$ to $X^4$ is a substituted or unsubstituted $C_1$ to $C_{20}$ alkoxy group, and at least one of $X^5$ to $X^{10}$ is a substituted or unsubstituted $C_1$ to $C_{20}$ alkoxy group.

$R^1$ to $R^4$ are one of same and different, and each of $R^1$ to $R^4$ are independently one of hydrogen, a substituted or unsubstituted $C_1$ to $C_{20}$ linear or branched alkyl group, a substituted or unsubstituted $C_3$ to $C_{20}$ cycloalkyl group, a substituted or unsubstituted $C_1$ to $C_{20}$ alkoxy group, a substituted or unsubstituted $C_6$ to $C_{30}$ aryl group, a substituted or unsubstituted $C_2$ to $C_{30}$ heteroaryl group, and a combination thereof, or optionally at least one of $CH_2$ groups of $R^1$ to $R^4$ is substituted with —O—, —S—, —$SO_2$—, —CO—, —OCO—, —COO—, —CH=CH—, —C≡C—, or —$SiR^{101}R^{102}$—, wherein $R^{101}$ and $R^{102}$ are one of same and different, and each of $R^{101}$ and $R^{102}$ are independently one of hydrogen, a substituted or unsubstituted $C_1$ to $C_{20}$ linear or branched alkyl group, a substituted or unsubstituted $C_3$ to $C_{20}$ cycloalkyl group, a substituted or unsubstituted $C_1$ to $C_{20}$ alkoxy group, a substituted or unsubstituted $C_6$ to $C_{30}$ aryl group, a substituted or unsubstituted $C_2$ to $C_{30}$ heteroaryl group, and a combination thereof.

Specifically, $R^1$ to $R^4$ are one of same and different, and each of $R^1$ to $R^4$ are independently one of hydrogen and a substituted or unsubstituted $C_1$ to $C_{20}$ alkyl group. More specifically, $R^1$ to $R^4$ are hydrogen.

[Chemical Formula 3]

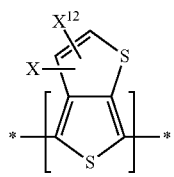

In Chemical Formula 3, $X^{11}$ and $X^{12}$ are one of same and different, and each $X^{11}$ and $X^{12}$ are independently one of hydrogen, a halogen, a substituted or unsubstituted $C_1$ to $C_{20}$ aliphatic organic group, hydroxyl group, a substituted or unsubstituted $C_1$ to $C_{20}$ alkoxy group, a substituted or unsubstituted $C_1$ to $C_{20}$ ester group, a thiol group, and —$SR^{103}$. Herein, $R^{103}$ is one of a substituted or unsubstituted $C_1$ to $C_{20}$ aliphatic organic group, a substituted or unsubstituted $C_2$ to $C_{30}$ aromatic organic group, and a substituted or unsubstituted $C_2$ to $C_{30}$ heterocycloalkyl group, and is specifically a substituted or unsubstituted $C_1$ to $C_{20}$ alkyl group. When $X^{11}$ and $X^{12}$ include an alkenyl group or an alkynyl group, $X^{11}$ and $X^{12}$ include one or two carbon-carbon unsaturated bonds, for example a carbon-carbon double bond and a carbon-carbon triple bond.

Specifically, the repeating unit according to Chemical Formula 3 may include at least one selected from a repeating unit according to Chemical Formula 3-1, a repeating unit according to Chemical Formula 3-2, and a combination thereof.

[Chemical Formula 3-1]

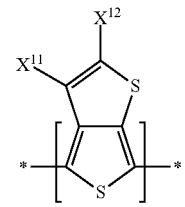

[Chemical Formula 3-2]

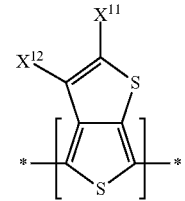

In Chemical Formulae 3-1 and 3-2, each $X^{11}$ are one of same and different in each repeating unit, and each $X^{11}$ are independently one of hydrogen and a halogen, and each $X^{12}$ are one of same and different in each repeating unit, and each $X^{12}$ are independently one of a substituted or unsubstituted $C_1$ to $C_{20}$ alkyl group, a substituted or unsubstituted $C_1$ to $C_{20}$ alkoxy group, and a substituted or unsubstituted $C_1$ to $C_{20}$ ester group.

Specifically, each $X^{11}$ are one of same and different in each repeating unit, and each $X^{11}$ are independently one of hydrogen and a halogen, and each $X^{12}$ are one of same and different in each repeating unit, and each $X^{12}$ are independently one of a substituted or unsubstituted $C_1$ to $C_{20}$ ester group.

[Chemical Formula 4]

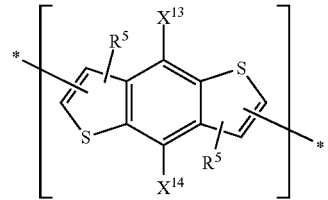

In Chemical Formula 4, $X^{13}$ and $X^{14}$ are one of same and different, and each one of $X^{13}$ and $X^{14}$ are independently one of hydrogen, a halogen, a substituted or unsubstituted $C_1$ to $C_{20}$ aliphatic organic group, a hydroxyl group, a substituted or unsubstituted $C_1$ to $C_{20}$ alkoxy group, a substituted or unsubstituted $C_1$ to $C_{20}$ ester group, a thiol group, and —$SR^{104}$, wherein $R^{104}$ is one of a substituted or unsubstituted $C_1$ to $C_{20}$ aliphatic organic group, a substituted or unsubstituted $C_2$ to $C_{30}$ aromatic organic group, and a substituted or unsubstituted $C_2$ to $C_{30}$ heterocycloalkyl group, and is specifically a substituted or unsubstituted $C_1$ to $C_{20}$ alkyl group. When $X^{13}$ and $X^{14}$ include an alkenyl group or an alkynyl group, $X^{13}$ and $X^{14}$ include one or two carbon-carbon unsaturated bonds, for example a carbon-carbon double bond and a carbon-carbon triple bond.

Specifically, $X^{13}$ and $X^{14}$ are one of same and different, and each of $X^{13}$ and $X^{14}$ are independently one of a substituted or unsubstituted $C_1$ to $C_{20}$ alkyl group, a substituted or unsubstituted $C_1$ to $C_{20}$ alkoxy group, a substituted or unsubstituted $C_1$ to $C_{20}$ ester group, and —$SR^{104}$, wherein $R^{104}$ is a substituted or unsubstituted $C_1$ to $C_{20}$ alkyl group. More specifically, $X^{13}$ and $X^{14}$ are one of same and different, and each $X^{13}$ and $X^{14}$ are independently a substituted or unsubstituted $C_1$ to $C_{20}$ alkoxy group.

$R^5$ and $R^6$ are one of same and different, and each of $R^5$ and $R^6$ are independently one of hydrogen, a substituted or unsubstituted $C_1$ to $C_{20}$ linear or branched alkyl group, a substituted or unsubstituted $C_3$ to $C_{20}$ cycloalkyl group, a substituted or unsubstituted $C_1$ to $C_{20}$ alkoxy group, a substituted or unsubstituted $C_6$ to $C_{30}$ aryl group, a substituted or unsubstituted $C_2$ to $C_{30}$ heteroaryl group, and a combination thereof, or optionally at least one of $CH_2$ groups of $R^5$ and $R^6$ is substituted with one of —O—, —S—, —$SO_2$—, —CO—, —OCO—, —COO—, —CH=CH—, —C≡C—, and —$SiR^{105}R^{106}$—, wherein $R^{105}$ and $R^{106}$ are one of same and different, and each of $R^{105}$ and $R^{106}$ are independently one of hydrogen, a substituted or unsubstituted $C_1$ to $C_{20}$ linear or branched alkyl group, a substituted or unsubstituted $C_3$ to $C_{20}$ cycloalkyl group, a substituted or unsubstituted $C_1$ to $C_{20}$ alkoxy group, a substituted or unsubstituted $C_6$ to $C_{30}$ aryl group, a substituted or unsubstituted $C_2$ to $C_{30}$ heteroaryl group, and a combination thereof.

Specifically, $R^5$ and $R^6$ are one of same and different, and each $R^5$ and $R^6$ are independently one of hydrogen and a substituted or unsubstituted $C_1$ to $C_{20}$ alkyl group. More specifically, $R^5$ and $R^6$ may be hydrogen.

[Chemical Formula 5]

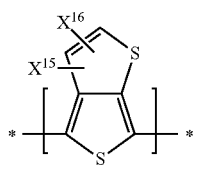

In Chemical Formula 5, $X^{15}$ and $X^{16}$ are one of same and different, and each of $X^{15}$ and $X^{16}$ are independently one of hydrogen, a halogen, a substituted or unsubstituted $C_1$ to $C_{20}$ aliphatic organic group, a hydroxyl group, a substituted or unsubstituted $C_1$ to $C_{20}$ alkoxy group, a substituted or unsubstituted $C_1$ to $C_{20}$ ester group, a thiol group, and —$SR^{107}$, wherein $R^{107}$ is one of a substituted or unsubstituted $C_1$ to $C_{20}$ aliphatic organic group, a substituted or unsubstituted $C_2$ to $C_{30}$ aromatic organic group, and a substituted or unsubstituted $C_2$ to $C_{30}$ heterocycloalkyl group, and is specifically a substituted or unsubstituted $C_1$ to $C_{20}$ alkyl group. When $X^{15}$ and $X^{16}$ include an alkenyl group or an alkynyl group, $X^{15}$ and $X^{16}$ include one or two carbon-carbon unsaturated bonds, for example a carbon-carbon double bond and a carbon-carbon triple bond.

Specifically, the repeating unit according to Chemical Formula 5 may include at least one selected from a repeating unit according to Chemical Formula 5-1, a repeating unit according to Chemical Formula 5-2, and a combination thereof.

[Chemical Formula 5-1]

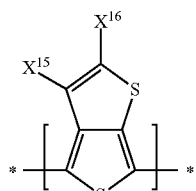

[Chemical Formula 5-2]

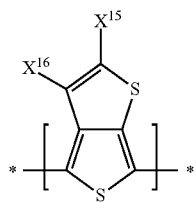

In Chemical Formulae 5-1 and 5-2, each $X^{15}$ are one of same and different in each repeating unit, and each $X^{15}$ are independently one of hydrogen and a halogen, and each $X^{16}$ are one of same and different in each repeating unit, and each $X^{16}$ are independently one of a substituted or unsubstituted $C_1$ to $C_{20}$ alkyl group, a substituted or unsubstituted $C_1$ to $C_{20}$ alkoxy group, and a substituted or unsubstituted $C_1$ to $C_{20}$ ester group.

Specifically, each $X^{15}$ are one of same and different in each repeating unit, and each $X^{15}$ are independently one of hydrogen and a halogen, and each $X^{16}$ are one of same and different in each repeating unit, and each $X^{16}$ are independently a substituted or unsubstituted $C_1$ to $C_{20}$ ester group.

In the electron-donating polymer, the repeating unit A includes a polycyclic aromatic group, for example, Chemical Formula 1 and Chemical Formula 2, which increases interaction among polymers and thus decreases a bandgap. Accordingly, the electron-donating polymer may absorb solar light in a wider wavelength region. In addition, the increased interaction among polymers improves the stacking structure of the electron-donating polymer, and also the hole mobility of the electron-donating polymer. As a result, the electron-donating polymer may have an improved fill factor (FF). Accordingly, when the electron-donating polymer is applied to an organic solar cell, the photoelectric conversion efficiency of the organic solar cell may be effectively improved.

In the electron-donating polymer, the repeating unit according to Chemical Formula 3 of the repeating unit A may work as an electron-accepting group. The repeating unit A may have a bandgap ranging from about 1.1 eV to about 2.5 eV. When a repeating unit A has a bandgap within the range, an electron-hole pair (exciton) may be easily formed, effectively maintaining a higher open circuit voltage (FF). Specifically, a repeating unit A may have a bandgap ranging from about 1.2 eV to about 1.95 eV.

In the repeating unit A, a repeating unit according to the above Chemical Formula 1 may include at least one selected from repeating units according to Chemical Formulae 6-1 to 6-3 and a combination thereof, a repeating unit according to the above Chemical Formula 2 may include at least one selected from repeating units according to Chemical Formulae 7-1 to 7-3 and a combination thereof, and a repeating unit according to the above Chemical Formula 3 may include at least one selected from repeating units according to Chemical Formulae 8-1 to 8-12 and a combination thereof, but are not limited thereto.

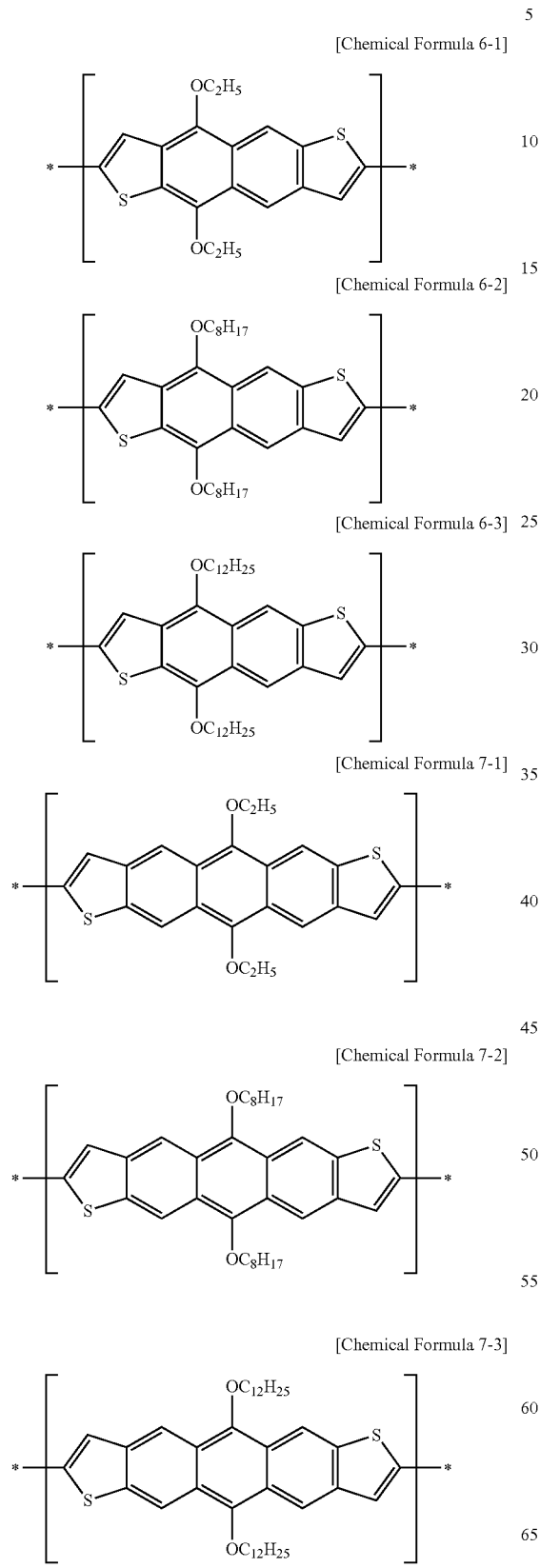

[Chemical Formula 6-1]

[Chemical Formula 6-2]

[Chemical Formula 6-3]

[Chemical Formula 7-1]

[Chemical Formula 7-2]

[Chemical Formula 7-3]

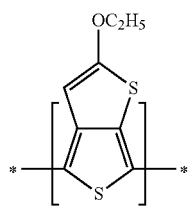

[Chemical Formula 8-1]

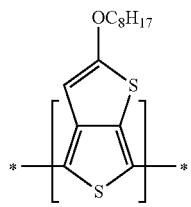

[Chemical Formula 8-2]

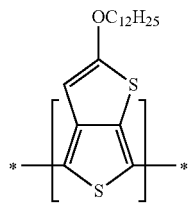

[Chemical Formula 8-3]

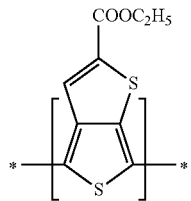

[Chemical Formula 8-4]

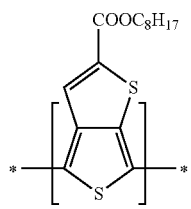

[Chemical Formula 8-5]

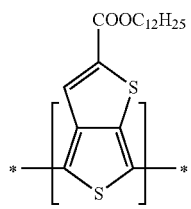

[Chemical Formula 8-6]

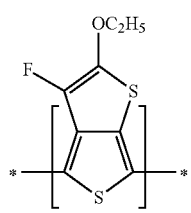

[Chemical Formula 8-7]

[Chemical Formula 8-8]
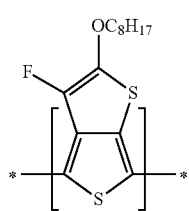

[Chemical Formula 8-9]
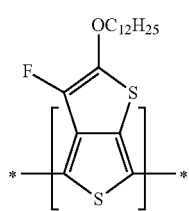

[Chemical Formula 8-10]
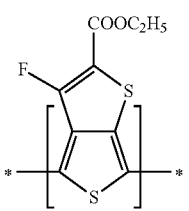

[Chemical Formula 8-11]
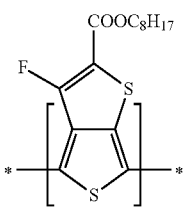

[Chemical Formula 8-12]
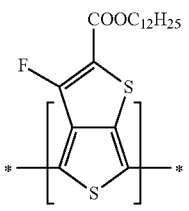

Specifically, a repeating unit A may include at least one selected from a repeating unit according to Chemical Formula 11, a repeating unit according to Chemical Formula 13, and a combination thereof, but is not limited thereto.

[Chemical Formula 11]
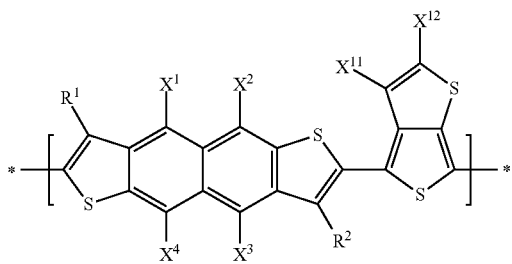

In Chemical Formula 11, $X^1$ to $X^4$ are one of same and different, and each of $X^1$ to $X^4$ are independently one of hydrogen, a substituted or unsubstituted $C_1$ to $C_{20}$ alkyl group, a substituted or unsubstituted $C_1$ to $C_{20}$ alkoxy group, and a substituted or unsubstituted $C_1$ to $C_{20}$ ester group, provided that at least one of $X^1$ to $X^4$ is one of a substituted or unsubstituted $C_1$ to $C_{20}$ alkyl group, a substituted or unsubstituted $C_1$ to $C_{20}$ alkoxy group, and a substituted or unsubstituted $C_1$ to $C_{20}$ ester group, each $X^{11}$ are one of same and different in each repeating unit, and each $X^{11}$ are independently one of hydrogen and a halogen, each $X^{12}$ are one of same and different in each repeating unit, and each $X^{12}$ are independently one of a substituted or unsubstituted $C_1$ to $C_{20}$ alkyl group, a substituted or unsubstituted $C_1$ to $C_{20}$ alkoxy group, and a substituted or unsubstituted $C_1$ to $C_{20}$ ester group, and $R^1$ and $R^2$ are one of same and different, and each $R^1$ and $R^2$ are independently one of hydrogen and a substituted or unsubstituted $C_1$ to $C_{20}$ alkyl group.

Specifically, $X^1$ to $X^4$ are one of same and different, and each $X^1$ to $X^4$ are independently one of hydrogen and a substituted or unsubstituted $C_1$ to $C_{20}$ alkoxy group. At least one of $X^1$ to $X^4$ may include a substituted or unsubstituted $C_1$ to $C_{20}$ alkoxy group, $R^1$ and $R^2$ may be hydrogen, each $X^{11}$ are one of same and different in each repeating unit and each $X^{11}$ are independently one of hydrogen and a halogen, and each $X^{12}$ are one of same and different in each repeating unit, and each $X^{12}$ are independently a substituted or unsubstituted $C_1$ to $C_{20}$ ester group.

[Chemical Formula 13]
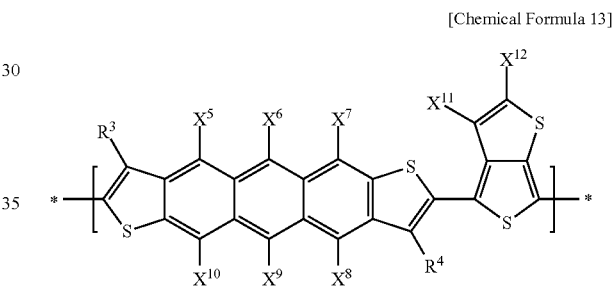

In Chemical Formula 13, $X^5$ to $X^{10}$ are one of same and different, and each $X^5$ to $X^{10}$ are independently one of hydrogen, a substituted or unsubstituted $C_1$ to $C_{20}$ alkyl group, a substituted or unsubstituted $C_1$ to $C_{20}$ alkoxy group, and a substituted or unsubstituted $C_1$ to $C_{20}$ ester group, and at least one of $X^5$ to $X^{10}$ is one of a substituted or unsubstituted $C_1$ to $C_{20}$ alkyl group, a substituted or unsubstituted $C_1$ to $C_{20}$ alkoxy group, and a substituted or unsubstituted $C_1$ to $C_{20}$ ester group, each $X^{11}$ are one of same and different in each repeating unit, and each $X^{11}$ are independently one of hydrogen and a halogen, each $X^{12}$ are one of same and different in each repeating unit, and each $X^{12}$ are independently a substituted or unsubstituted $C_1$ to $C_{20}$ alkyl group, a substituted or unsubstituted $C_1$ to $C_{20}$ alkoxy group, and a substituted or unsubstituted $C_1$ to $C_{20}$ ester group, and $R^3$ and $R^4$ are one of same and different and $R^3$ and $R^4$ are independently one of hydrogen and a substituted or unsubstituted $C_1$ to $C_{20}$ alkyl group.

Specifically, $X^5$ to $X^{10}$ are one of same and different, and each $X^5$ to $X^{10}$ are independently hydrogen and a substituted or unsubstituted $C_1$ to $C_{20}$ alkoxy group, at least one of $X^5$ to $X^{10}$ is a substituted or unsubstituted $C_1$ to $C_{20}$ alkoxy group, $R^3$ and $R^4$ are hydrogen, each $X^{11}$ are one of same and different in each repeating unit, and each $X^{11}$ are independently one of hydrogen and a halogen, and each $X^{12}$ are one of same and different in each repeating unit, and each $X^{12}$ are independently a substituted or unsubstituted $C_1$ to $C_{20}$ ester group.

Specifically, the repeating unit A may include at least one selected from repeating units according to Chemical Formulae 11-1 to 11-36, repeating units according to Chemical Formulae 13-1 to 13-36, and a combination thereof, but is not limited thereto.

[Chemical Formula 11-1]

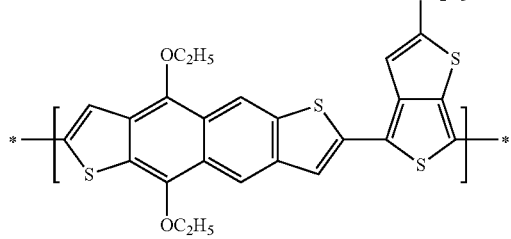

[Chemical Formula 11-2]

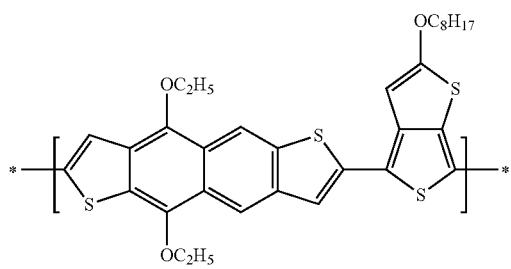

[Chemical Formula 11-3]

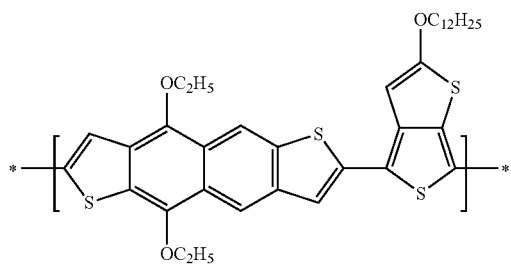

[Chemical Formula 11-4]

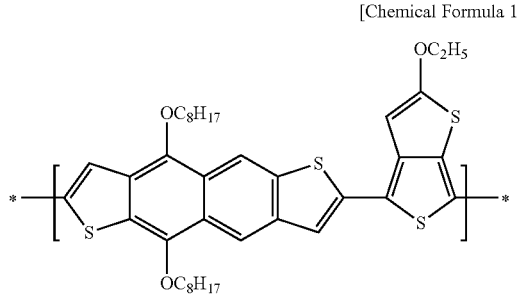

[Chemical Formula 11-5]

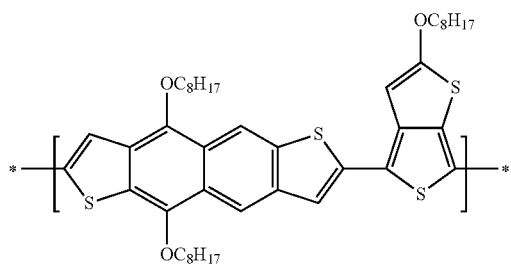

-continued

[Chemical Formula 11-6]

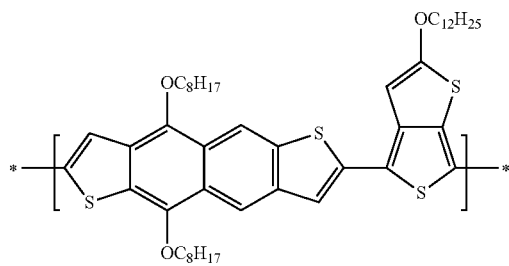

[Chemical Formula 11-7]

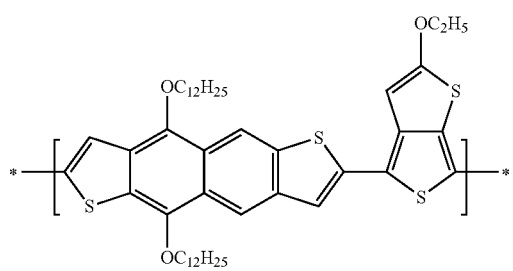

[Chemical Formula 11-8]

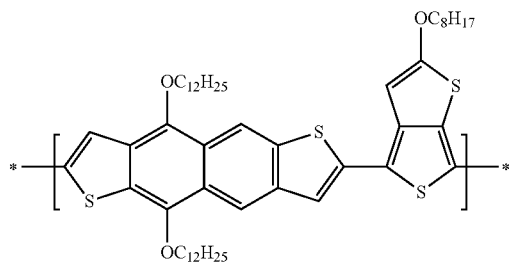

[Chemical Formula 11-9]

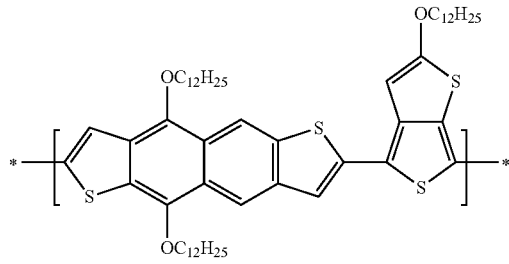

[Chemical Formula 11-10]

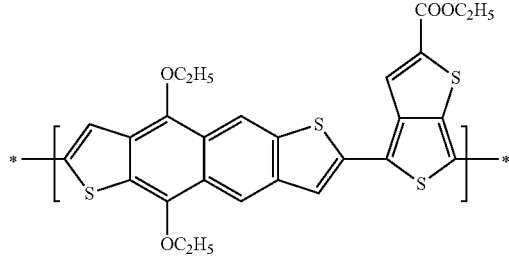

-continued
[Chemical Formula 11-11]
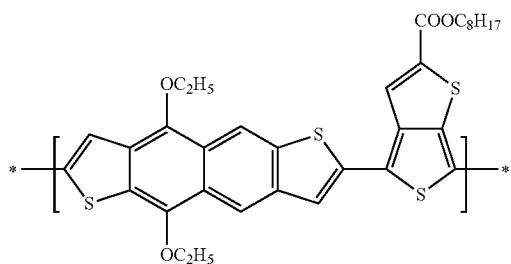
[Chemical Formula 11-12]
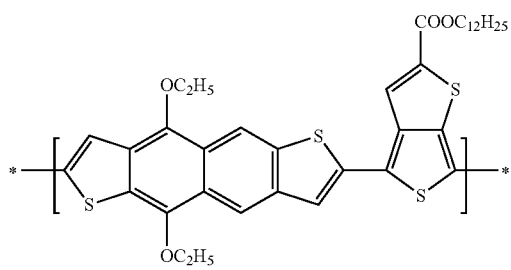
[Chemical Formula 11-13]
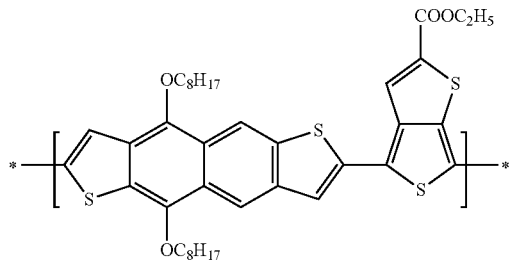
[Chemical Formula 11-14]
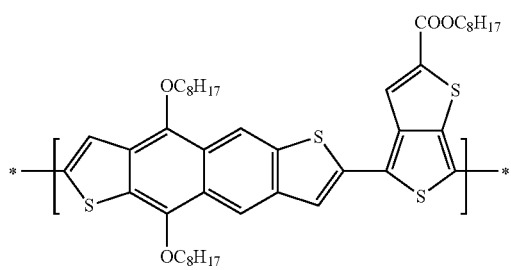
[Chemical Formula 11-15]
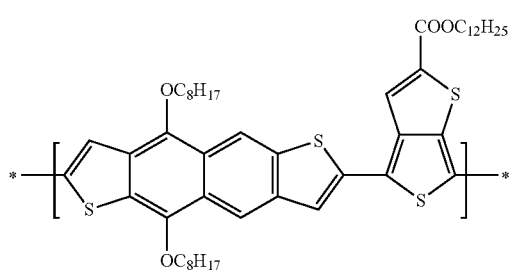
-continued
[Chemical Formula 11-16]
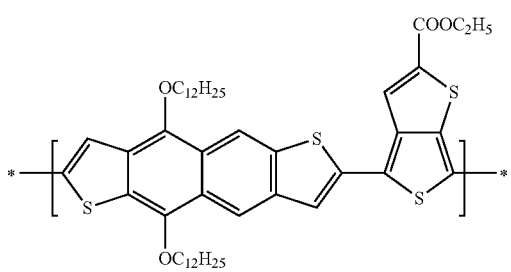
[Chemical Formula 11-17]
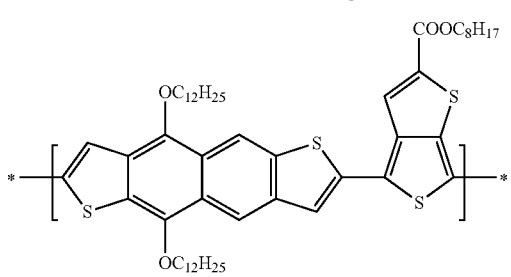
[Chemical Formula 11-18]
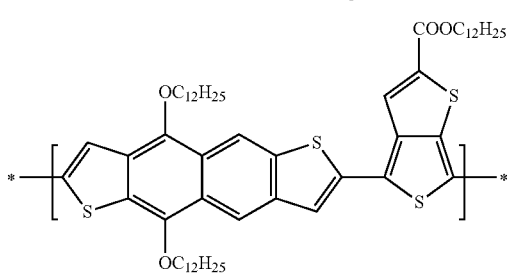
[Chemical Formula 11-19]
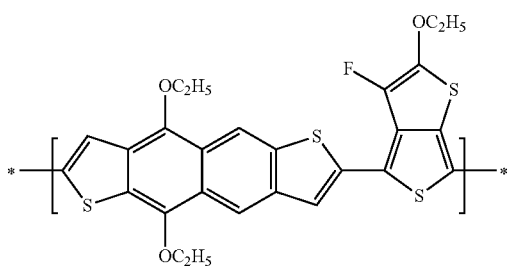
[Chemical Formula 11-20]
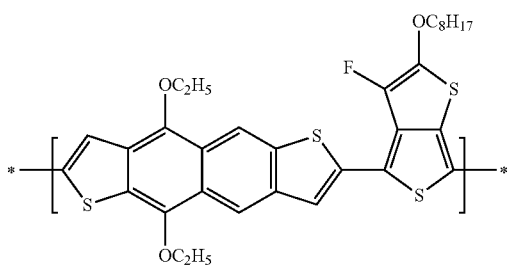

[Chemical Formula 11-21]
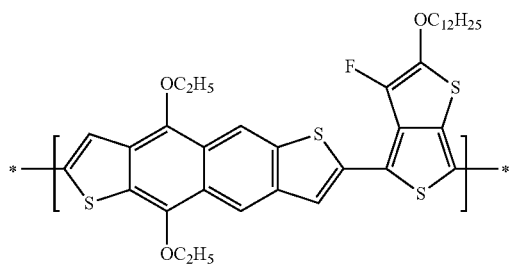
[Chemical Formula 11-22]
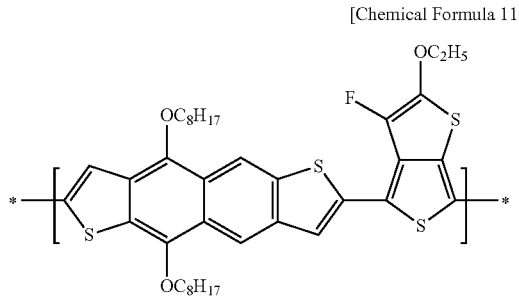
[Chemical Formula 11-23]
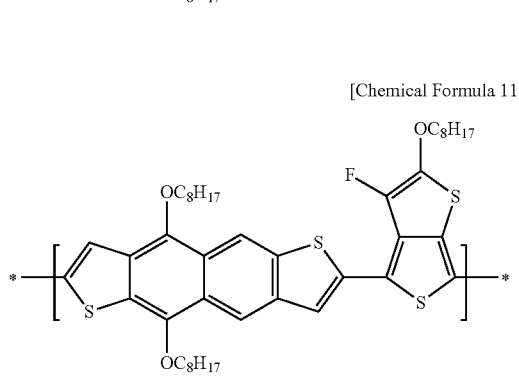
[Chemical Formula 11-24]
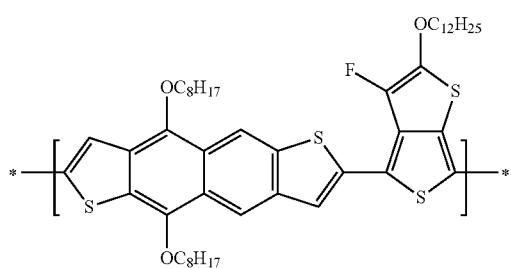
[Chemical Formula 11-25]
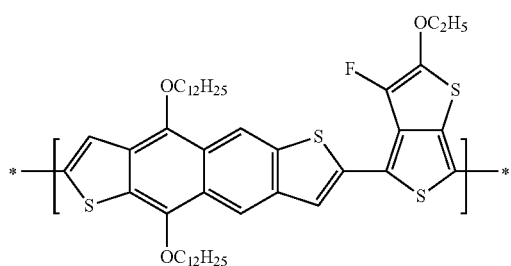
[Chemical Formula 11-26]
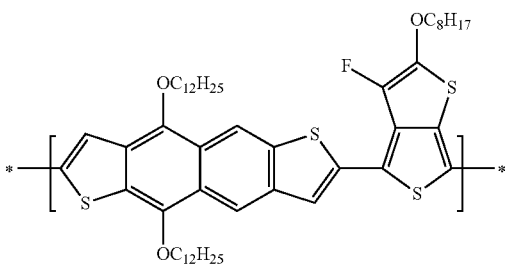
[Chemical Formula 11-27]
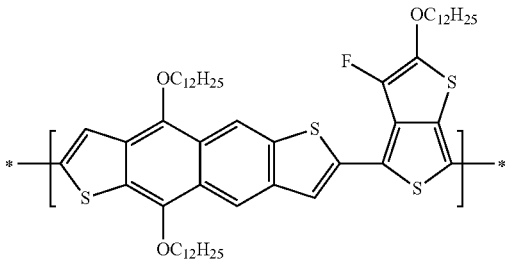
[Chemical Formula 11-28]
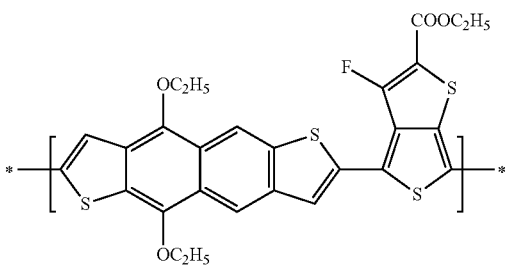
[Chemical Formula 11-29]
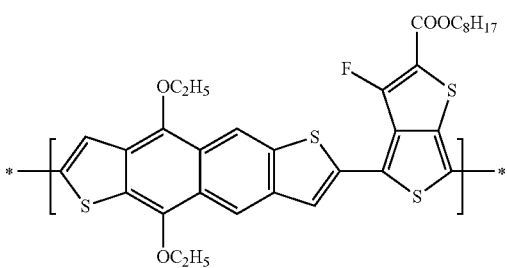
[Chemical Formula 11-30]
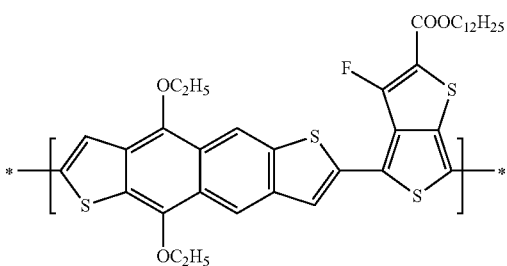

[Chemical Formula 11-31]
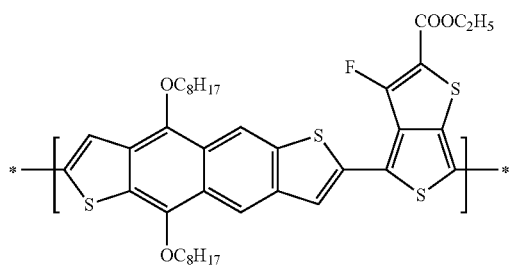
[Chemical Formula 11-32]
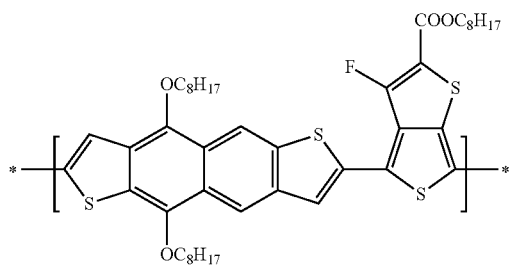
[Chemical Formula 11-33]
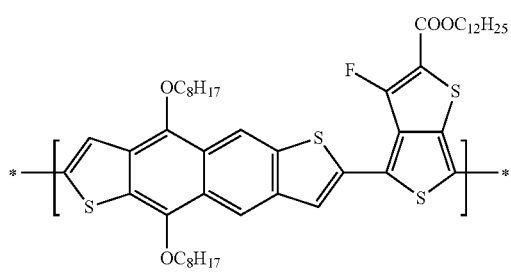
[Chemical Formula 11-34]
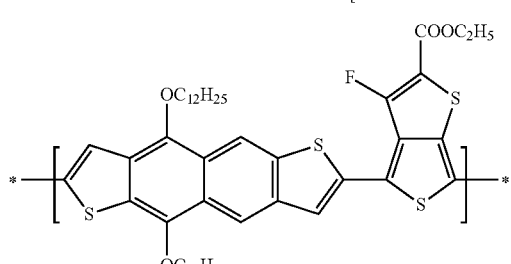
[Chemical Formula 11-35]
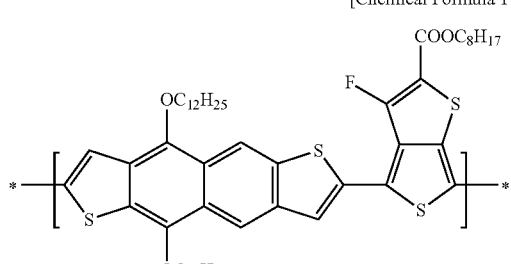
[Chemical Formula 11-36]
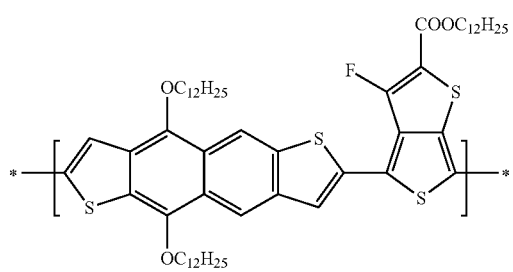
[Chemical Formula 13-1]
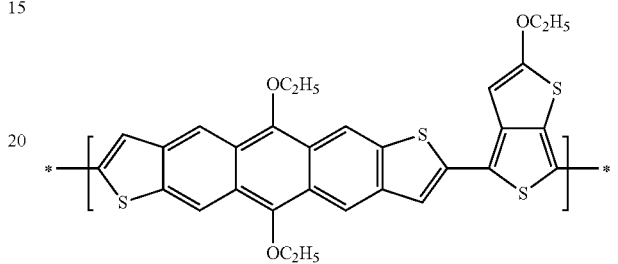
[Chemical Formula 13-2]
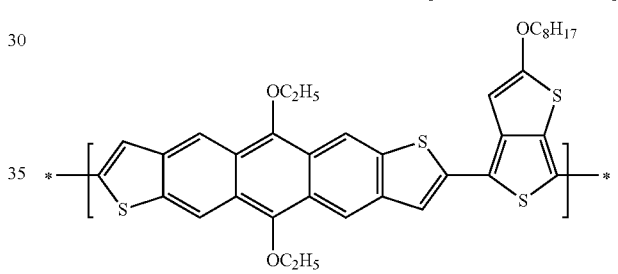
[Chemical Formula 13-3]
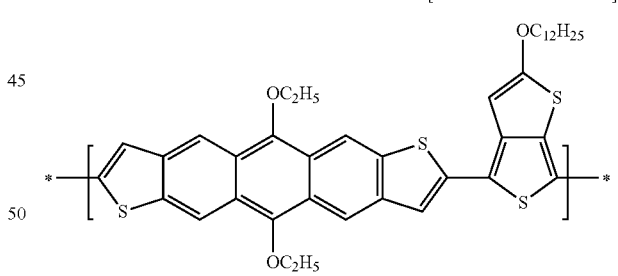
[Chemical Formula 13-4]
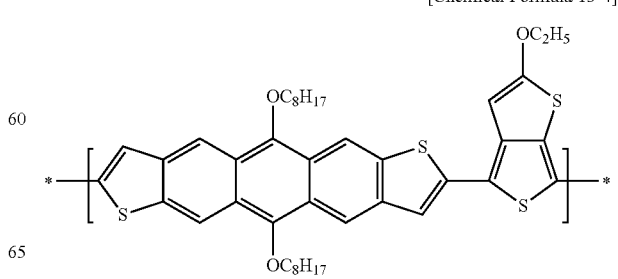

[Chemical Formula 13-5]

[Chemical Formula 13-6]

[Chemical Formula 13-7]

[Chemical Formula 13-8]

[Chemical Formula 13-9]

[Chemical Formula 13-10]

[Chemical Formula 13-11]

[Chemical Formula 13-12]

[Chemical Formula 13-13]

[Chemical Formula 13-14]

[Chemical Formula 13-15]
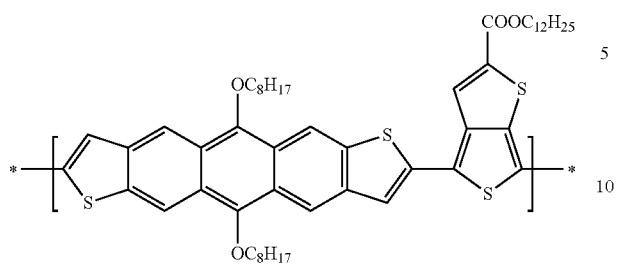
[Chemical Formula 13-16]
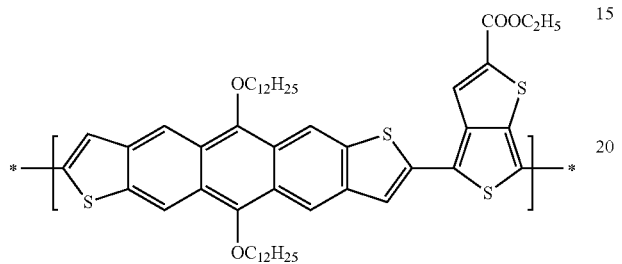
[Chemical Formula 13-17]
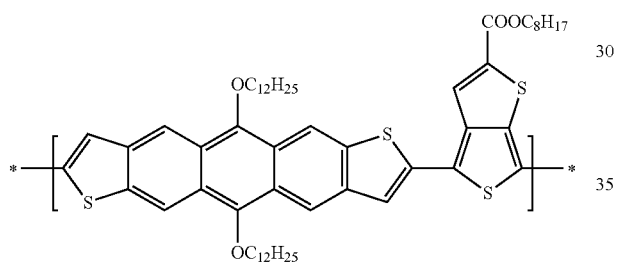
[Chemical Formula 13-18]
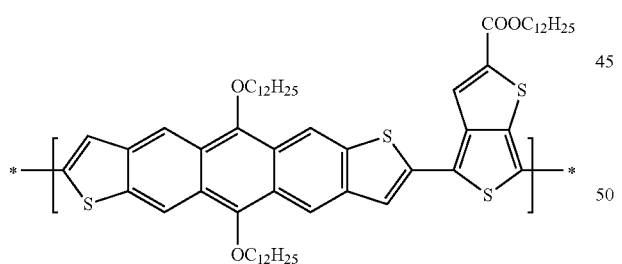
[Chemical Formula 13-19]
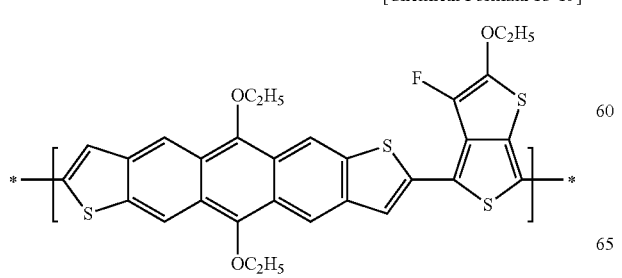
[Chemical Formula 13-20]
[Chemical Formula 13-21]
[Chemical Formula 13-22]
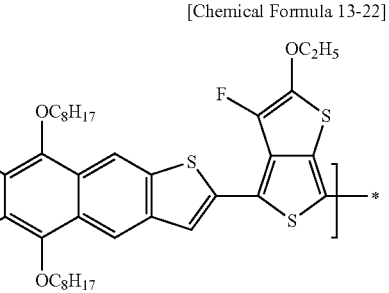
[Chemical Formula 13-23]
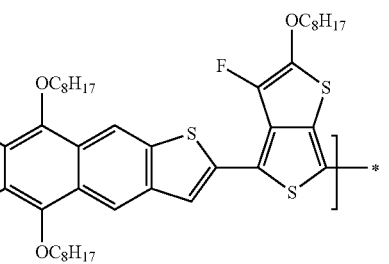
[Chemical Formula 13-24]
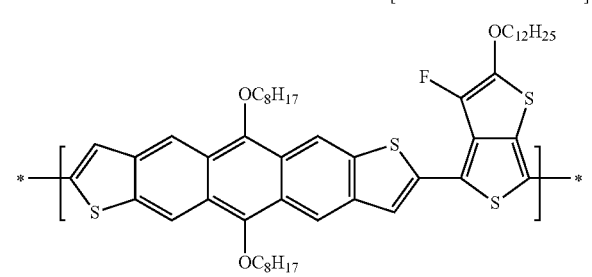

[Chemical Formula 13-25]
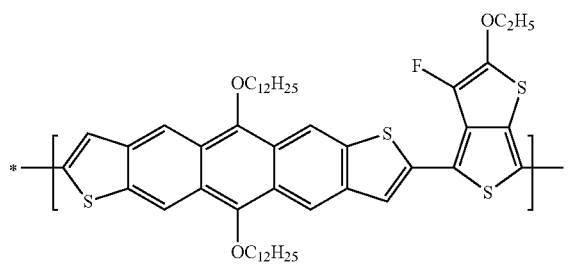
[Chemical Formula 13-30]
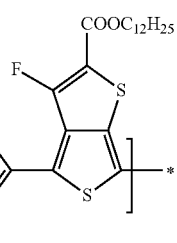
[Chemical Formula 13-26]
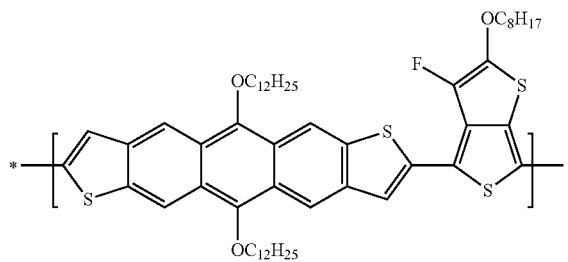
[Chemical Formula 13-31]
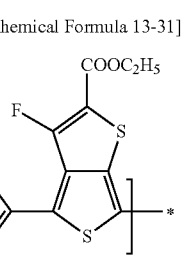
[Chemical Formula 13-27]
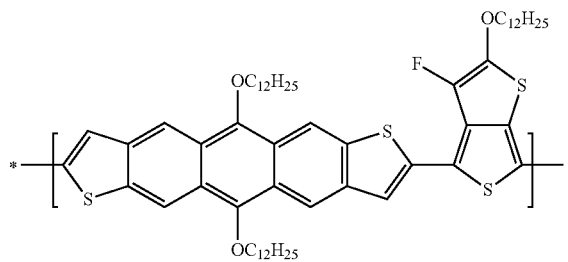
[Chemical Formula 13-32]
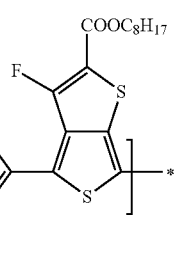
[Chemical Formula 13-28]
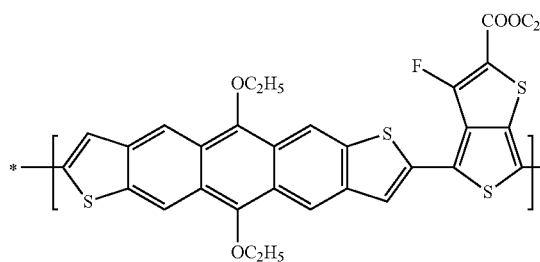
[Chemical Formula 13-33]
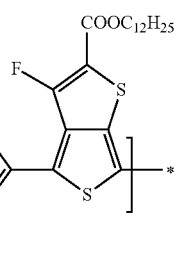
[Chemical Formula 13-29]
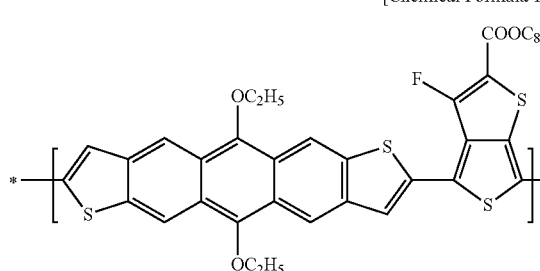
[Chemical Formula 13-34]
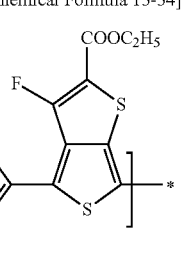

-continued

[Chemical Formula 13-35]

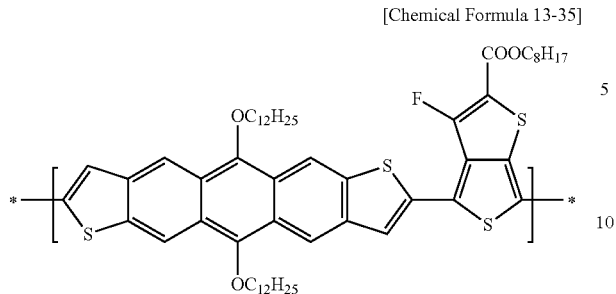

[Chemical Formula 13-36]

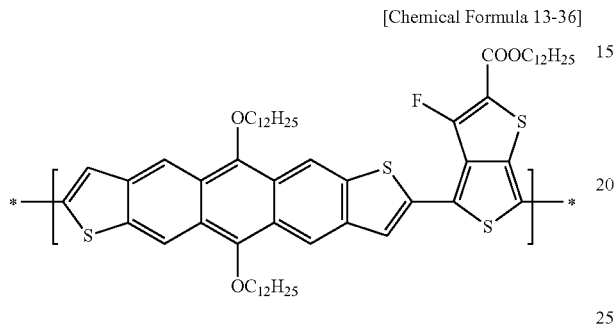

In the electron-donating polymer, the repeating unit B includes a functional group induced from benzodithiophene according to the above Chemical Formula 4, and thus has improved solubility in an organic solvent. Accordingly, because the electron-donating polymer has no phase separation, the electron-donating polymer is uniformly mixed with an electron acceptor and thus may improve morphology of a photoactive layer. In addition, an electron-donating polymer with a high molecular weight may be easily prepared, and thus may improve hole mobility of a solar cell. Furthermore, the electron-donating polymer may be easily used to fabricate a solar cell. In addition, the electron-donating polymer may be easily regulated regarding bandgap by controlling the amount of the repeating unit B including a repeating unit according to the above Chemical Formula 4 and regarding solar light absorption efficiency by controlling a substituent. Accordingly, when the electron-donating polymer is used for an organic solar cell, the electron-donating polymer may effectively improve photoelectric conversion efficiency of the organic solar cell.

The repeating unit according to Chemical Formula 5 of the repeating unit B may work as an electron-accepting group.

The repeating unit B may have hole mobility ranging from about $1 \times 10^{-6}$ cm$^2$/V·s to about $9 \times 10^{-1}$ cm$^2$/V·s. When the repeating unit B has hole mobility within the range, an improved current characteristic may be realized. Specifically, the repeating unit B may have hole mobility ranging from about $1 \times 10^{-6}$ cm$^2$/V·s to about $1 \times 10^{-1}$ cm$^2$/V·s.

Specifically, in the repeating unit B, a repeating unit according to the above Chemical Formula 4 may include at least one selected from repeating units according to Chemical Formulae 9-1 to 9-9 and a combination thereof, and a repeating unit according to the above Chemical Formula 5 may include at least one selected from repeating units according to Chemical Formulae 10-1 to 10-12 and a combination thereof, but is not limited thereto.

[Chemical Formula 9-1]

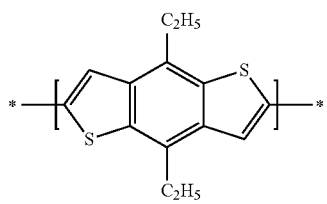

[Chemical Formula 9-2]

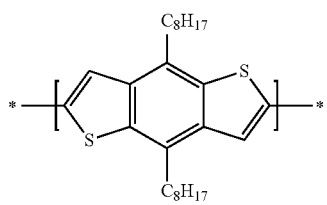

[Chemical Formula 9-3]

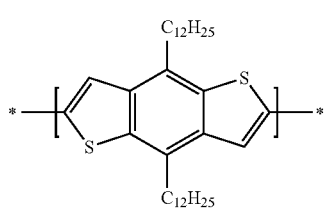

[Chemical Formula 9-4]

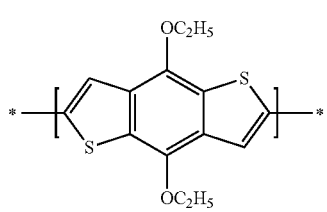

[Chemical Formula 9-5]

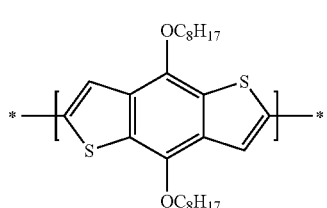

[Chemical Formula 9-6]

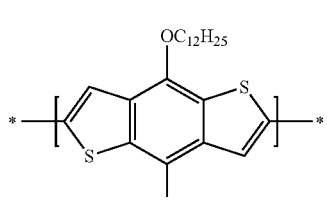

[Chemical Formula 9-7]

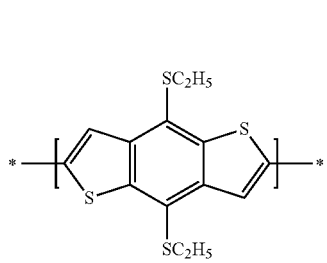

-continued

[Chemical Formula 9-8]
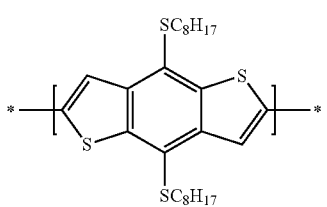

[Chemical Formula 9-9]
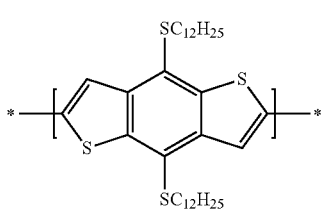

[Chemical Formula 10-1]
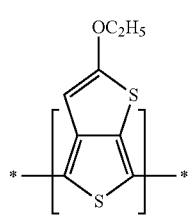

[Chemical Formula 10-2]
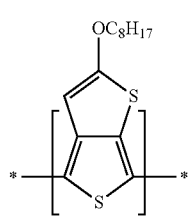

[Chemical Formula 10-3]
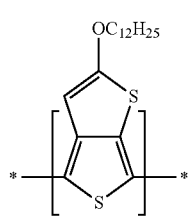

[Chemical Formula 10-4]
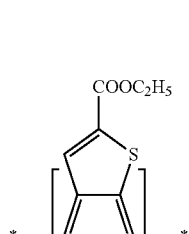

[Chemical Formula 10-5]
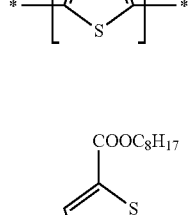

[Chemical Formula 10-6]
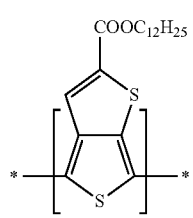

[Chemical Formula 10-7]
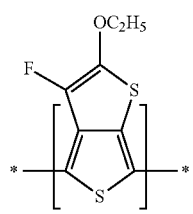

[Chemical Formula 10-8]
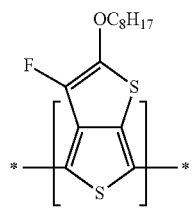

[Chemical Formula 10-9]
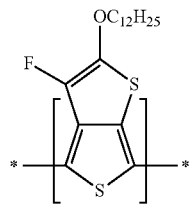

[Chemical Formula 10-10]
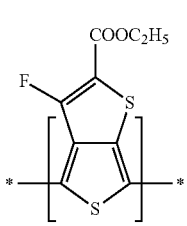

[Chemical Formula 10-11]
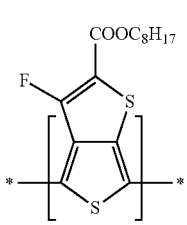

[Chemical Formula 10-12]
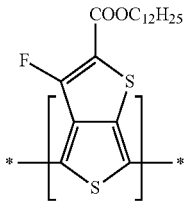

Specifically, a repeating unit B may include a repeating unit according to Chemical Formula 12, but is not limited thereto.

[Chemical Formula 12]

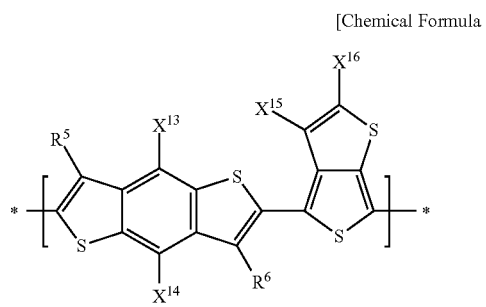

In Chemical Formula 12, $X^{13}$ and $X^{14}$ are one of same and different, and each of $X^{13}$ and $X^{14}$ are independently one of a substituted or unsubstituted $C_1$ to $C_{20}$ alkyl group, a substituted or unsubstituted $C_1$ to $C_{20}$ alkoxy group, a substituted or unsubstituted $C_1$ to $C_{20}$ ester group, and $—SR^{104}$, wherein $R^{104}$ is a substituted or unsubstituted $C_1$ to $C_{20}$ alkyl group, each $X^{15}$ are one of same and different in each repeating unit, and each $X^{15}$ are independently one of hydrogen and a halogen, each $X^{16}$ are one of same and different in each repeating unit, and each $X^{16}$ are independently one of a substituted or unsubstituted $C_1$ to $C_{20}$ alkyl group, a substituted or unsubstituted $C_1$ to $C_{20}$ alkoxy group, and a substituted or unsubstituted $C_1$ to $C_{20}$ ester group, and $R^5$ and $R^6$ are one of same and different, and each $R^5$ and $R^6$ are independently one of hydrogen and a substituted or unsubstituted $C_1$ to $C_{20}$ alkyl group.

Specifically, $X^{13}$ and $X^{14}$ are one of same and different, and each $X^{13}$ and $X^{14}$ are independently a substituted or unsubstituted $C_1$ to $C_{20}$ alkoxy group, $R^5$ and $R^6$ are hydrogen, each $X^{15}$ are one of same and different in each repeating unit, and each $X^{15}$ are independently one of hydrogen and a halogen, and each $X^{16}$ are one of same and different in each repeating unit, and each $X^{16}$ are independently a substituted or unsubstituted $C_1$ to $C_{20}$ ester group.

In particular, the repeating unit B may include at least one selected from repeating units according to Chemical Formulae 12-1 to 12-16 and a combination thereof, but is not limited thereto.

[Chemical Formula 12-1]

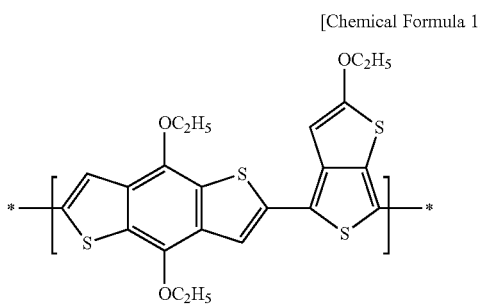

[Chemical Formula 12-2]

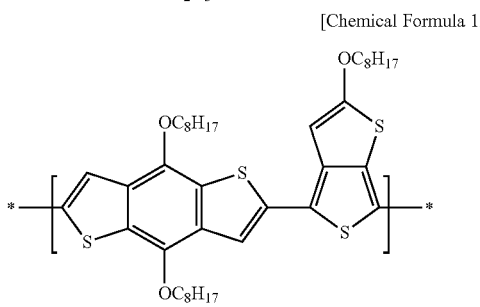

[Chemical Formula 12-3]

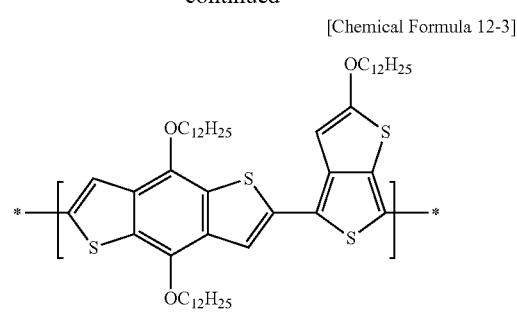

[Chemical Formula 12-4]

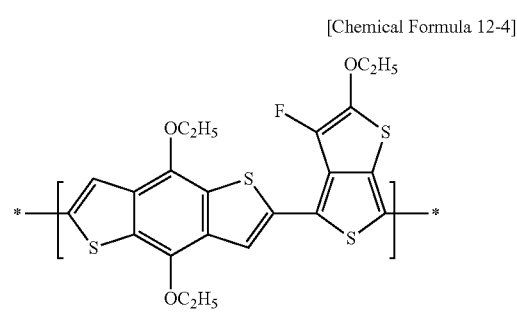

[Chemical Formula 12-5]

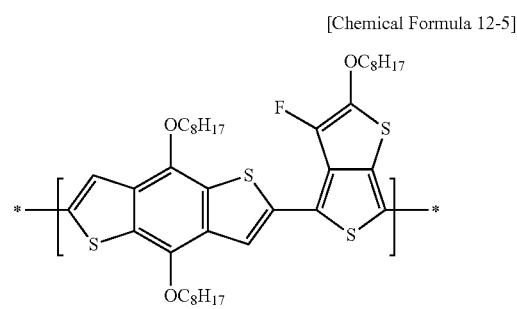

[Chemical Formula 12-6]

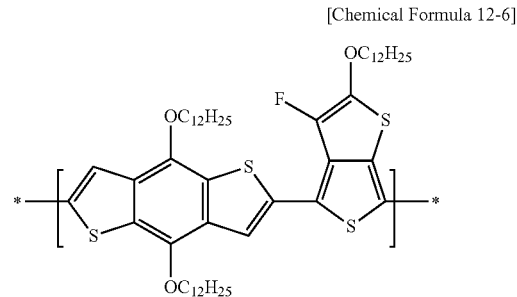

[Chemical Formula 12-7]

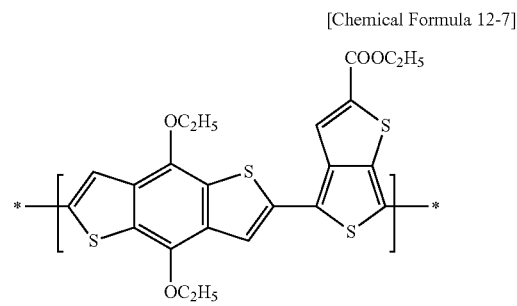

[Chemical Formula 12-8]

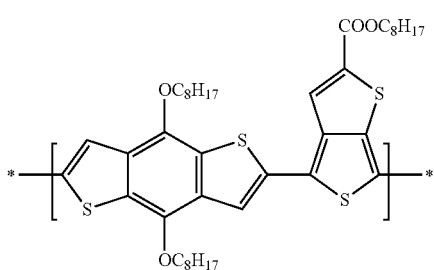

[Chemical Formula 12-9]

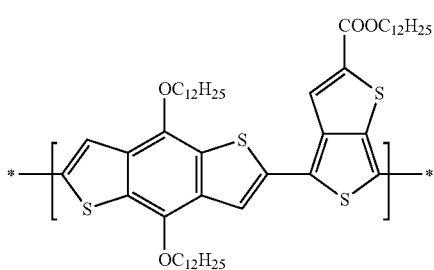

[Chemical Formula 12-10]

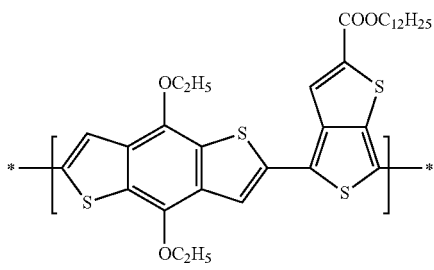

[Chemical Formula 12-11]

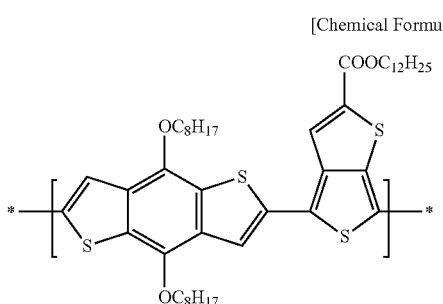

[Chemical Formula 12-12]

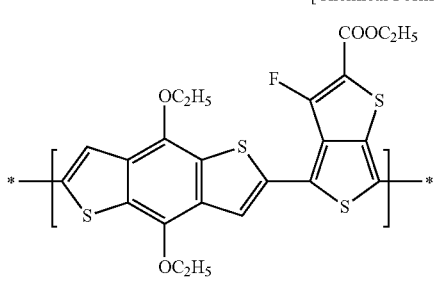

[Chemical Formula 12-13]

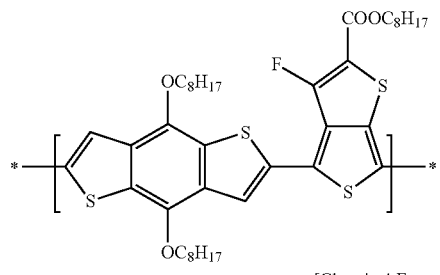

[Chemical Formula 12-14]

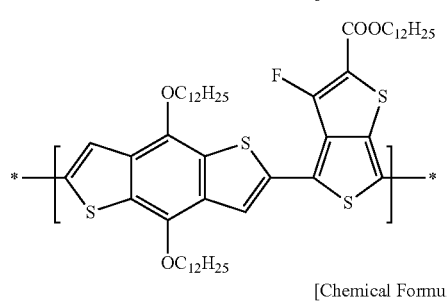

[Chemical Formula 12-15]

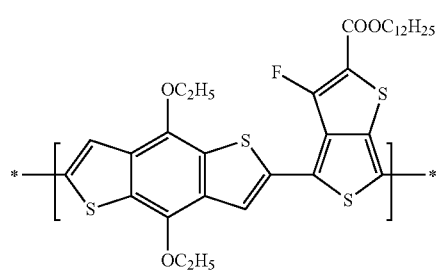

[Chemical Formula 12-16]

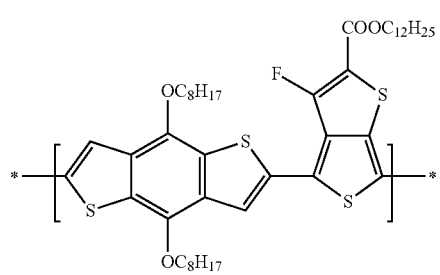

The electron-donating polymer may include the repeating unit A and the repeating unit B in a mole ratio ranging from about 1:10 to about 10:1. When the repeating units A and B are included within the mole ratio range, the repeating units A and B may effectively control a bandgap and a number average molecular weight of the electron-donating polymer. Within the mole ratio, the electron-donating polymer may be easily prepared using a solution process. In addition, because the electron-donating polymer has no phase separation and is uniformly mixed with an electron acceptor when formed into a photoactive layer, the electron-donating polymer may improve morphology of a solar cell. Specifically, the electron-donating polymer may include the repeating unit A and the repeating unit B in a mole ratio ranging from about 1:5 to about 5:1, and in particular, from 1:3 to 3:1.

The electron-donating polymer may have a number average molecular weight ranging from about 1,000 to about 800,000. When the electron-donating polymer has a number average molecular weight within the range, the electron-donating polymer may be regulated regarding solution composition and thus is effectively controlled regarding properties.

In addition, the electron-donating polymer may be easily processed and thus, may be more easily used to fabricate an organic solar cell. In particular, the electron-donating polymer may have a number average molecular weight ranging from about 2000 to about 100,000, and more particularly, from about 2000 to about 50,000.

The electron-donating polymer may have a bandgap ranging from about 1.1 eV to about 2.5 eV. When the electron-donating polymer has a bandgap within the range, the electron-donating polymer may effectively absorb solar light in a large wavelength region and increase shortcut current density (Jsc), and accordingly effectively improves efficiency of an organic solar cell. Specifically, the electron-donating polymer may have a bandgap ranging from about 1.2 eV to about 2.0 eV, and more particularly, about 1.25 eV to about 1.85 eV.

The electron-donating polymer may have a hole mobility ranging from about $1\times10^{-6}$ cm2/V·s to about $9\times10^{-1}$ cm$^2$/V·s. When the electron-donating polymer has hole mobility within the range, an improved current characteristic may be realized. Specifically, the electron-donating polymer may have hole mobility ranging from about $1\times10^{-6}$ cm$^2$/V·s to about $1\times10^{-1}$ cm$^2$/V·s.

Hereinafter, referring to FIG. 1, an organic solar cell according to example embodiments is illustrated. FIG. 1 provides a cross-sectional view of an organic solar cell according to example embodiments.

Referring to FIG. 1, an organic solar cell 100 according to example embodiments may include a substrate 10, a lower electrode 20 on one surface of the substrate 10, a photoactive layer 30 on one surface of the lower electrode 20, and an upper electrode 40 on one surface of the photoactive layer 30.

The substrate 10 may be made of a transmitting material, for example, an inorganic material, e.g., glass or an organic material, for example, polycarbonate, polymethylmethacrylate, polyethylene terephthalate, polyethylene naphthalate, polyamide, and polyethersulfone.

Either of the lower electrode 20 and the upper electrode 40 may be an anode, while the other may be a cathode. Either of the lower electrode 20 and the upper electrode 40 may be made of a transparent conductor, e.g., indium tin oxide (ITO), indium-doped zinc oxide (IZO), tin oxide (SnC$_2$), aluminum-doped zinc oxide (AZO) and/or gallium-doped zinc oxide (GZO), while the other may be made of an opaque conductor, e.g., aluminum (Al), silver (Ag), gold (Au) and/or lithium (Li).

The photoactive layer 30 may include an electron acceptor made of an n-type semiconductor material and an electron donor made of a p-type semiconductor material.

The electron acceptor may include, for example, fullerene with large electron affinity (e.g., C60, C70, C74, C76, C78, C82, C84, C720, and C860), fullerene derivatives (e.g., 1-(3-methoxy-carbonyl)propyl-1-phenyl(6,6)C61 (PCBM), C71-PCBM, C84-PCBM, and bis-PCBM), perylene, and an inorganic semiconductor (e.g., CdS, CdTe, CdSe, and ZnO), or a combination thereof.

The electron donor includes the aforementioned electron-donating polymer. When the electron-donating polymer is included, the organic solar cell may have a higher short circuit current density ($J_{sc}$) than a conventional organic solar cell and effectively improved hole mobility. Accordingly, the organic solar cell may have improved photoelectric conversion efficiency.

The electron acceptor and the electron donor may have, for example, a bulk heterojunction structure. The bulk heterojunction structure generates a photocurrent by diffusing a pair of electron-holes excited by light absorbed in the photoactive layer 30 into an interface between the electron acceptor and the electron donor, separating the pair of electron-holes into electrons and holes due to an electronic affinity difference of two materials on the interface, and moving the electrons through the electron acceptor to the cathode and the holes through the electron donor to the anode.

Hereinafter, the inventive concepts are illustrated in more detail with reference to examples. However, these are example embodiments and are not limiting.

EXAMPLE

Example 1

Preparation of Electron-Donating Polymer

An electron-donating polymer is prepared according to Reaction Scheme 1.

[Reaction Scheme 1]

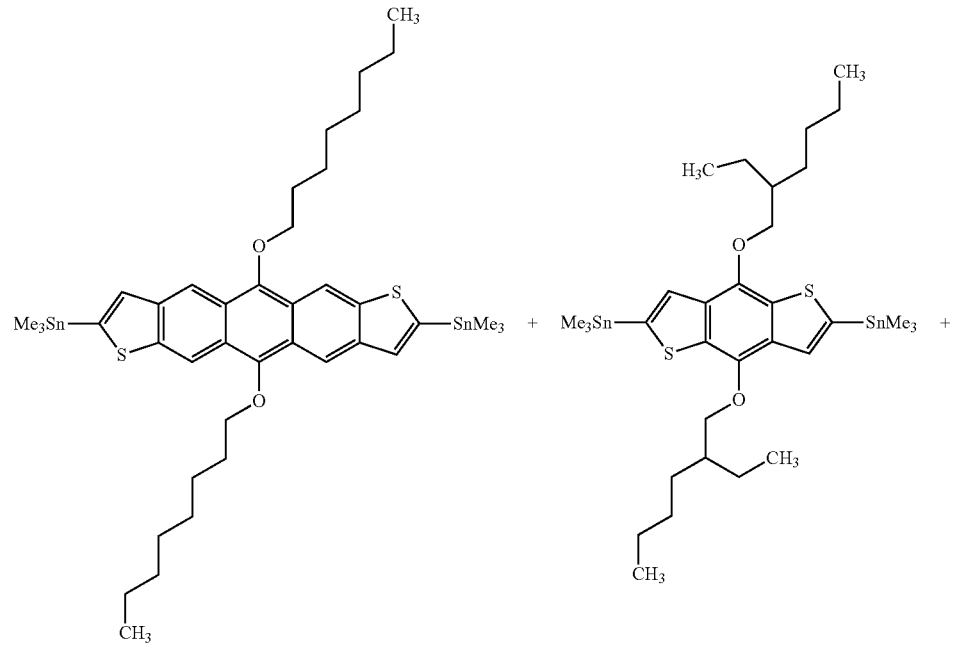

-continued

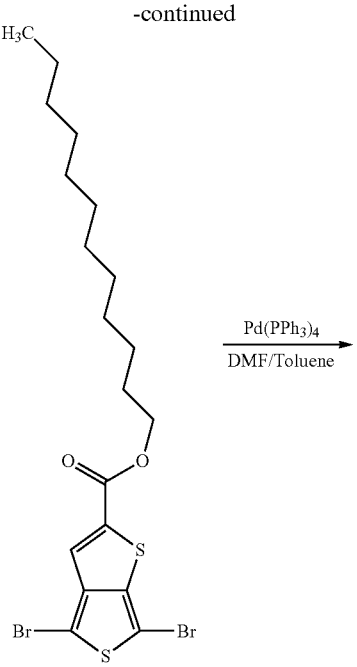

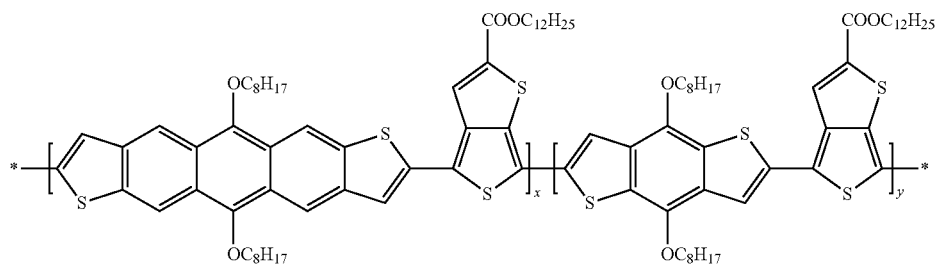

0.06 mmol of bis(trimethyl tin)-5,11-bis(octyloxy)anthra[2,3-b:6,7-b']dithiophene, 0.18 mmol of 2,6-bis(trimethyltin)-1,8-bis((2-ethylhexyl)oxy)benzo[1,2-b:4,5-b']dithiophene, and 0.24 mmol of dodecyl carboxy-6-dibromo-thieno[3,4-b]thiophene are put in 7.5 ml of a mixture of dimethylforamide(DMF)/toluene prepared in a volume ratio of 1:4, and 0.011 mmol of Pd(PPh₃)₄ as a catalyst may be added thereto. The resulting mixture may be agitated at 120° C. for 6 hours, preparing an electron-donating polymer. The electron-donating polymer has a number average molecular weight of 12,000.

Example 2

Preparation of Electron-Donating Polymer

An electron-donating polymer is prepared according to the same method as Example 1 except for using 0.12 mmol of bis(trimethyltin)-5,11-bis(octyloxy)anthra[2,3-b:6,7-b']dithiophene and 0.12 mmol of 2,6-bis(trimethyltin)-1,8-bis((2-ethylhexyl)oxy)benzo[1,2-b:4,5-b]dithiophene. The electron-donating polymer has a number average molecular weight of 15000.

Example 3

Preparation of Electron-Donating Polymer

An electron-donating polymer is prepared according to the same method as Example 1, except for using 0.18 mmol of bis(trimethyltin)-5,11-bis(octyloxy)anthra[2,3-b:6,7-b']dithiophene and 0.06 mmol of 2,6-bis(trimethyltin)-1,8-bis((2-ethylhexyl)oxy)benzo[1,2-b:4, 5-b']dithiophene. The electron-donating polymer has a number average molecular weight of 12,500.

Example 4

Preparation of Electron-Donating Polymer

An electron-donating polymer is prepared according to Reaction Scheme 2.

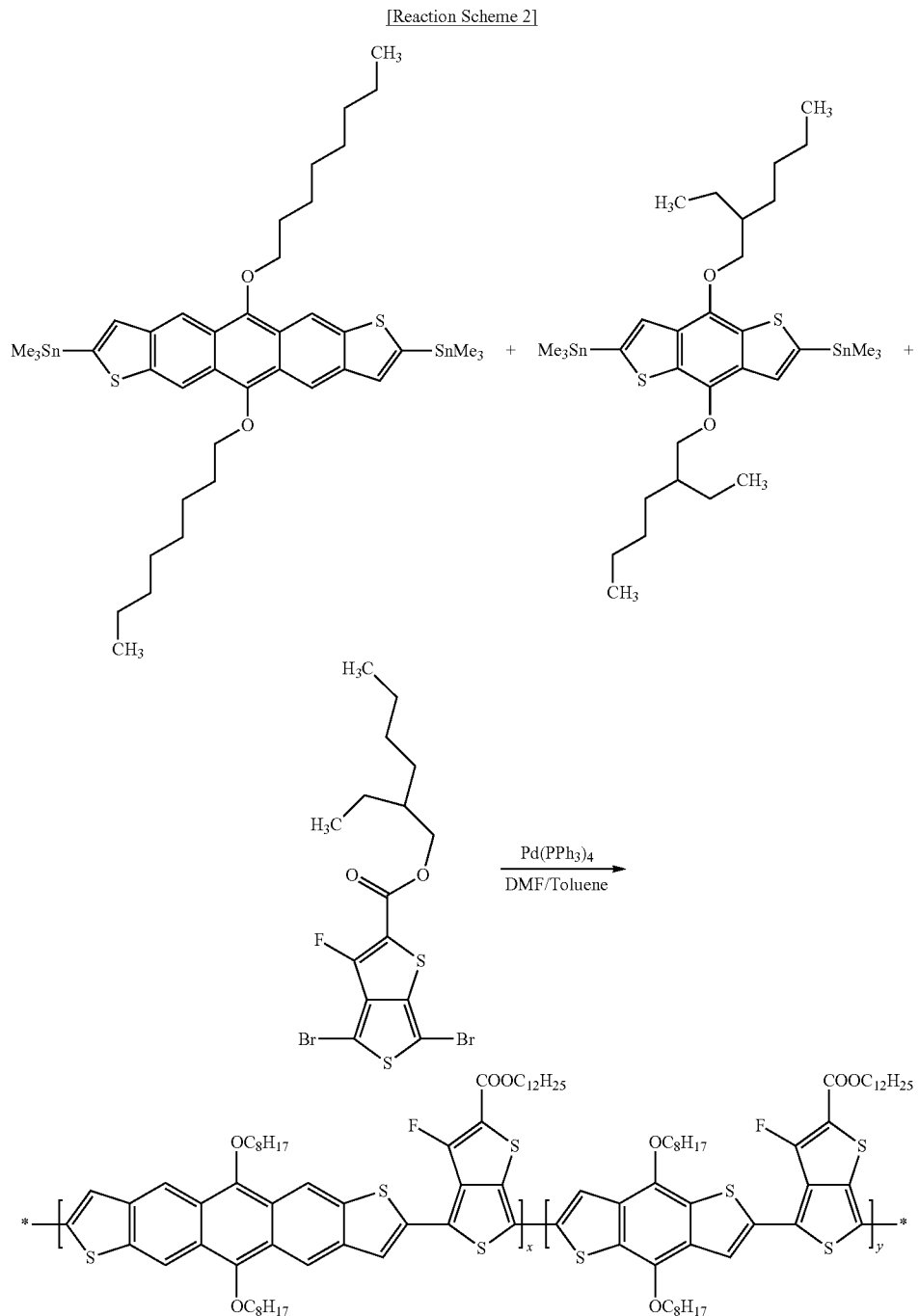

[Reaction Scheme 2]

0.03 mmol of bis(trimethyltin)-5,11-bis(octyloxy)anthra[2,3-b:6,7-b']dithiophene, 0.09 mmol of 2,6-bis(trimethyltin)-1,8-bis((2-ethylhexyl)oxy)benzo[1,2-b:4,5-b']dithiophene, and 0.12 mmol of 2-ethylhexyl carboxy-6-dibromo-3-fluorothieno[3,4-b]thiophene are put in 5 ml of a mixture of dimethylforamide/toluene in a volume ratio=1:4, and 0.0055 mmol of $Pd(PPh_3)_4$ as a catalyst is added thereto. The resulting mixture is agitated at 120° C. for 6 hours, preparing an electron-donating polymer. The electron-donating polymer has a number average molecular weight of 32,000.

Example 5

Preparation of Electron-Donating Polymer

An electron-donating polymer is prepared according to the same method as Example 4, except for using 0.06 mmol of bis(trimethyltin)-5,11-bis(octyloxy)anthra[2,3-b:6,7-b']dithiophene and 0.06 mmol of 2,6-bis(trimethyltin)-1,8-bis((2-ethylhexyl)oxy)benzo[1,2-b:4,5-b']dithiophene. The electron-donating polymer has a number average molecular weight of 28,000.

Example 6

Preparation of Electron-Donating Polymer

An electron-donating polymer is prepared according to the same method as Example 4, except for using 0.09 mmol of bis(trimethyltin)-5,11-bis(octyloxy)anthra[2,3-b:6,7-b']dithiophene and 0.03 mmol of 2,6-bis(trimethyltin)-1,8-bis((2-ethylhexyl)oxy)benzo[1,2-b:4,5-b']dithiophene. The electron-donating polymer has a number average molecular weight of 29,500.

Comparative Example 1

Preparation of Electron-Donating Polymer

An electron-donating polymer is prepared according to Reaction Scheme 3.

[Reaction Scheme 3]

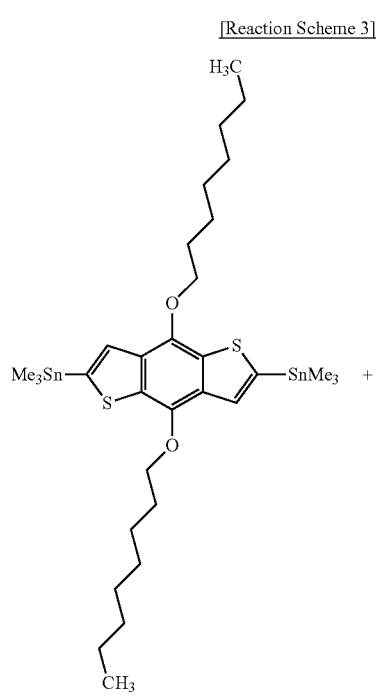
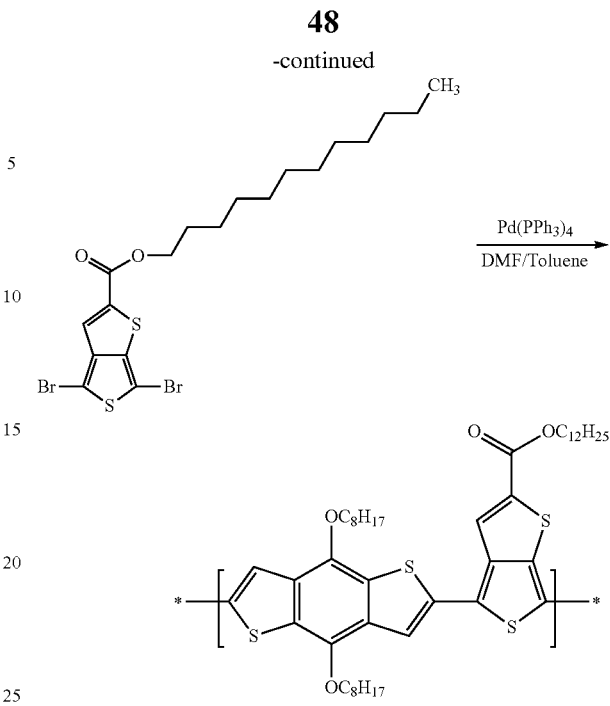

An electron-donating polymer is prepared by putting 0.250 mmol of 2,6-bis(trimethyltin)-1,8-bis(octyloxy)benzo[1,2-b:4,5-b']dithiophene and 0.250 mmol of dodecyl carboxy-6-dibromo-thieno[3,4-b]thiophene in 5 ml of a mixture of DMF/toluene mixed in a volume ratio=1:4, and 0.010 mmol of Pd(PPh$_3$)$_4$ as a catalyst is added thereto. The resulting mixture is agitated at 120° C. for 6 hours, preparing an electron-donating polymer. The electron-donating polymer has a number average molecular weight of 40,000.

Comparative Example 2

Preparation of Electron-Donating Polymer

An electron-donating polymer is prepared according to Reaction Scheme 4.

[Reaction Scheme 4]

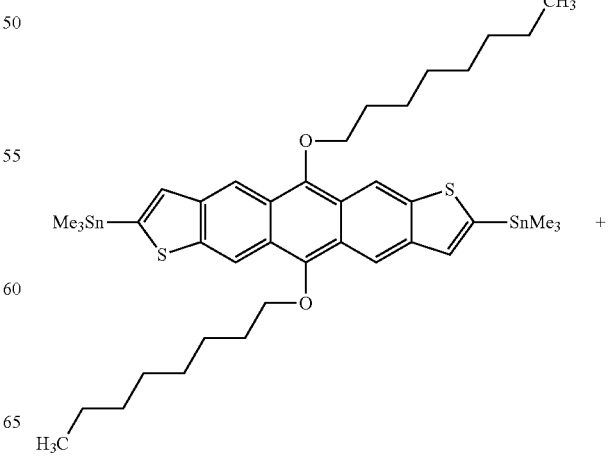

-continued

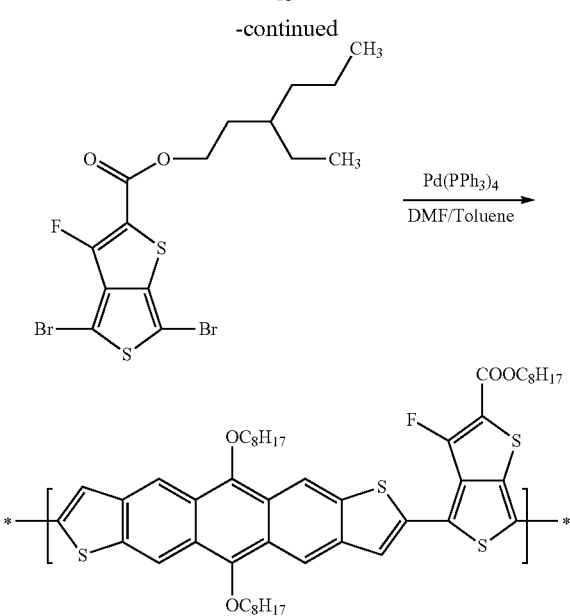

An electron-donating polymer is prepared by putting 0.10 mmol of bis(trimethyltin)-5,11-bis(octyloxy)anthra[2,3-b:6,7-b']dithiophene and 0.10 mmol of 2-ethylhexyl carboxyl-6-dibromo-3-fluorothieno[3,4-b]thiophene in 5 ml of a mixture of dimethylformamide (DMF)/toluene mixed in a volume ratio=1:4, and 0.004 mmol of Pd(PPh$_3$)$_4$ as a catalyst is added thereto. The resulting mixture is agitated at 120° C. for 6 hours, preparing an electron-donating polymer. The electron-donating polymer has a number average molecular weight of 12,000.

Comparative Example 3

Preparation of Electron-Donating Polymer

A polymer including a repeating unit according to Chemical Formula 14 is used as an electron-donating polymer. The electron-donating polymer has a number average molecular weight of 35,000.

[Chemical Formula 14]

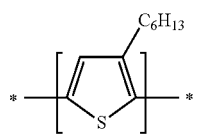

Example 7

Fabrication of Solar Cell

First, a 1 mm-thick transparent glass substrate is prepared. Next, a 150 nm-thick indium tin oxide (ITO) anode is sputtered on the transparent glass substrate.

Then, a 30 nm-thick PEDOT:PSS (poly(3,4-ethylene dioxythiophene):poly(styrenesulfonate)) layer is spin-coated on the ITO anode, and then fired for 1 hour. The spin coating is performed by using SPIN-1200D (Midas System Co. Ltd.) equipment.

Then, 8 mg of the electron-donating polymer according to Example 1 and 12 mg of C71-PCBM are put in 0.97 ml of chlorobenzene, and 0.03 mg of diiodooctane is added thereto. The mixture is agitated for 14 hours. The resulting mixture is spin-coated (2000 rpm) to form an 80 nm-thick photoactive layer on the PEDOT:PSS layer. The spin coating is performed by using SPIN-1200D (Midas System Co. Ltd.) equipment.

Then, a 20 nm/80 nm-thick Ca/Al cathode formed on the photoactive layer in a thermal evaporation method. The thermal evaporation is performed by using equipment made by GV Tech Co. In this way, a solar cell is fabricated.

Example 8 to 12

Fabrication of Solar Cell

Each solar cell is fabricated according to the same method as Example 7, except for respectively using electron-donating polymers according to Examples 2 to 6.

Comparative Example 4

Fabrication of Solar Cell

A solar cell is fabricated according to the same method as Example 7, except for forming a 100 nm-thick photoactive layer on the PEDOT:PSS layer by putting 12 mg of the electron-donating polymer according to Comparative Example 1 and 12 mg of C71-PCBM in 0.97 ml of chlorobenzene, adding 0.03 mg of diiodooctane thereto, and agitating the mixture for 14 hours and spin-coating (2500 rpm) the resulting mixture.

Comparative Example 5 and 6

Fabrication of Solar Cell

A solar cell is fabricated according to the same method as Comparative Example 4, except for using each electron donating polymer according to Comparative Examples 2 and 3.

Experimental Example 1

IR Measurement

Figure 2:
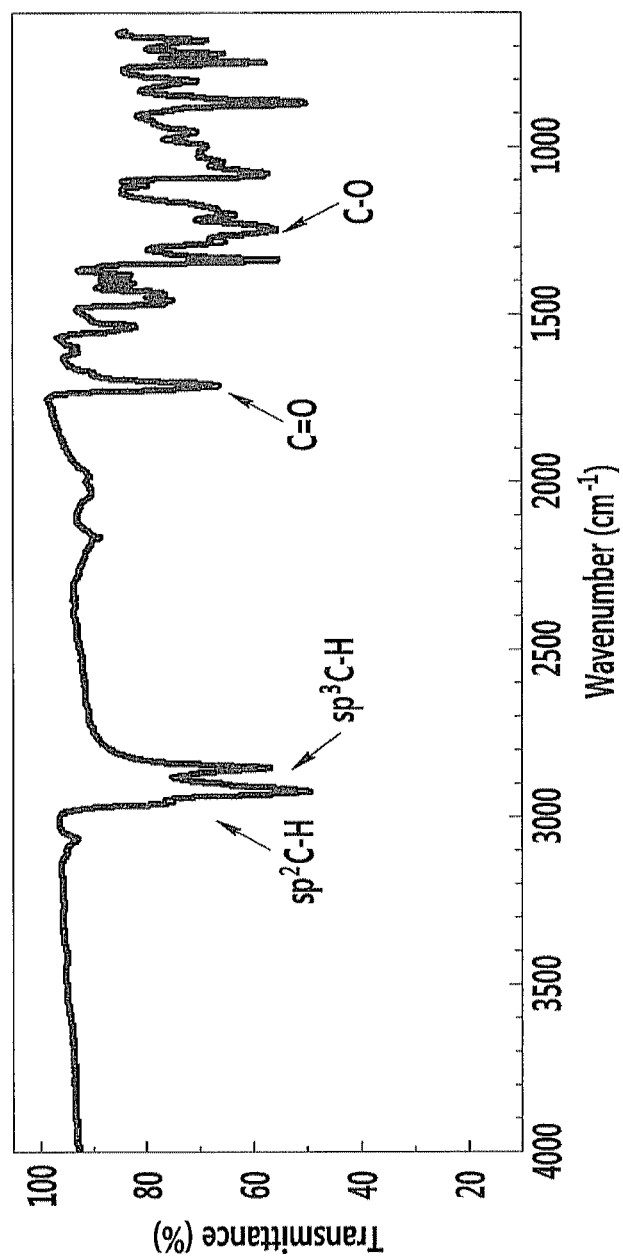
FIG. 2 shows an IR spectrum of an electron-donating polymer according to Example 1.

The IR spectra of electron-donating polymers according to Examples 1 to 6 and Comparative Examples 1 to 3 are acquired according to an ATR method by using a Bio Rad FTS 6000 FTIR spectrometer. FIG. 2 shows the IR spectrum of the electron-donating polymer according to Example 1, FIG. 3 shows the IR spectrum of the electron-donating polymer according to Example 4, and FIG. 4 shows the IR spectrum of the electron-donating polymer according to Comparative Example 2.

As shown in FIG. 2, the electron-donating polymer Example 1 has a 2953 cm$^{-1}$ peak showing aromatic CH stretching, a 2850 cm$^{-1}$ peak showing aliphatic CH stretching, a 1708 cm$^{-1}$ peak showing C=O stretching, and 1240 cm$^{-1}$ and 1082 cm$^{-1}$ peaks showing C—O stretching, and thus turns out to be a resulting material according to the aforementioned Reaction Scheme 1.

Figure 3:
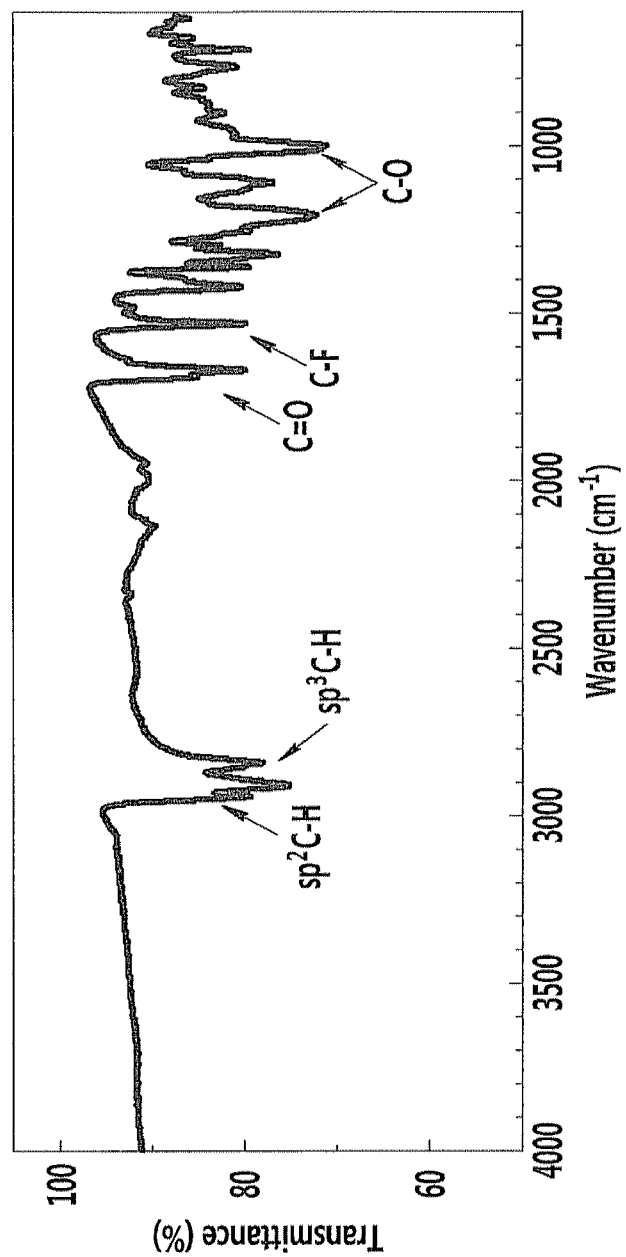
FIG. 3 shows an IR spectrum of an electron-donating polymer according to Example 4.

As shown in FIG. 3, the electron-donating polymer according to Example 4 has a 2954 cm$^{-1}$ peak showing aromatic CH stretching, a 2856 cm$^{-1}$ peak showing aliphatic CH stretching, a 1703 cm$^{-1}$ peak showing C=O stretching, a 1568 cm$^{-1}$ peak showing C—F stretching, and 1244 cm$^{-1}$ and 1047 cm$^{-1}$ peaks showing C—O stretching, and thus turns out to be a resulting material according to Reaction Scheme 2.

Figure 4:
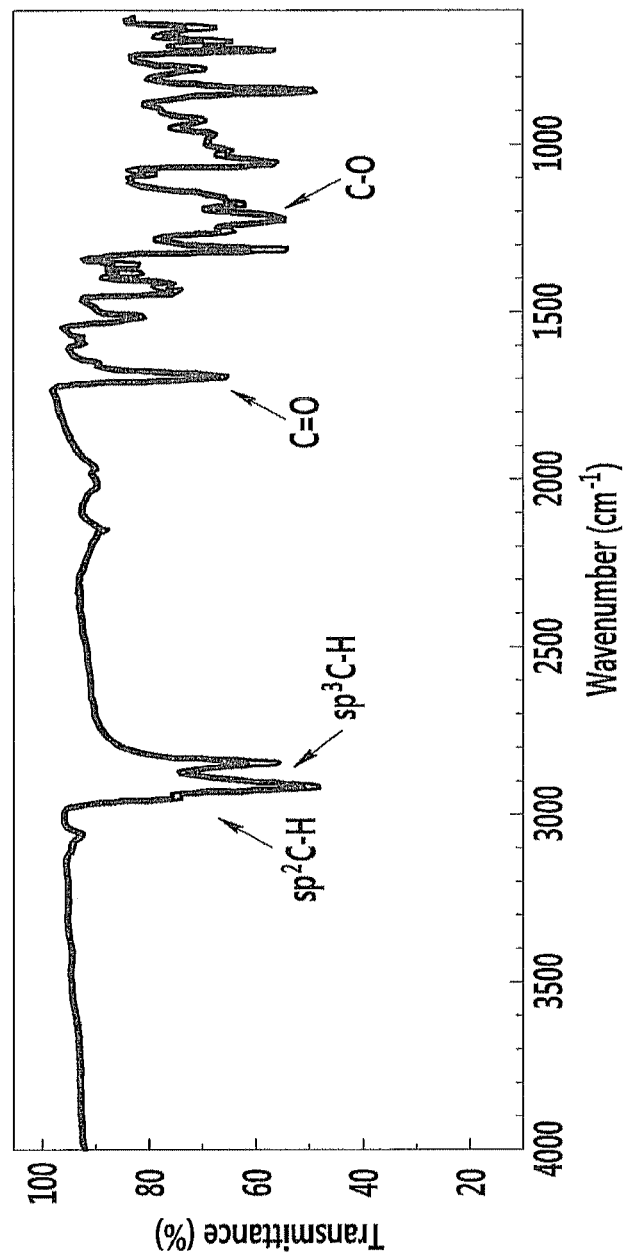
FIG. 4 shows an IR spectrum of an electron-donating polymer according to Comparative Example 2.

As shown in FIG. 4 the electron-donating polymer according to Comparative Example 2 has a 2954 cm$^{-1}$ peak showing aromatic CH stretching, a 2848 cm$^{-1}$ peak showing aliphatic CH stretching, a 1708 cm$^{-1}$ peak showing C=O stretching, and a 1247 cm$^{-1}$ peak showing C—O stretching, and thus turns out to be a resulting material according to the aforementioned Reaction Scheme 4.

Experimental Example 2

Bandgap Measurement

The electron-donating polymers according to Examples 1 to 6 and Comparative Examples 1 to 3 are respectively measured regarding HOMO level, LUMO level, and bandgap in a cyclic voltammetry (CV) method. The results are provided in the following Table 1.

TABLE 1

|  | HOMO (eV) | LUMO (eV) | Bandgap (eV) |
|---|---|---|---|
| Example 1 | −5.145 | −3.575 | 1.57 |
| Example 2 | −5.060 | −3.5 | 1.56 |
| Example 3 | −5.035 | −3.485 | 1.55 |
| Example 4 | −5.005 | −3.415 | 1.59 |
| Example 5 | −5.035 | −3.465 | 1.57 |
| Example 6 | −5.015 | −3.435 | 1.58 |
| Comparative Example 1 | −4.9 | −3.2 | 1.7 |
| Comparative Example 2 | −4.595 | −3.045 | 1.55 |
| Comparative Example 3 | −4.97 | −3.07 | 1.9 |

As shown in Table 1, the electron-donating polymers according to Examples 1 to 6 have smaller bandgaps than the electron-donating polymers according to Comparative Example 1 and 3. The bandgaps of the electron-donating polymers according to Examples 1 to 6 may be regulated by controlling the mole ratio of a repeating unit included therein. On the other hand, the electron-donating polymers of Examples 1 to 6 have equivalent bandgaps to that of the electron-donating polymer of Comparative Example 2.

The reason is that a multicyclic aromatic organic group included in the electron-donating polymers according to Examples 1 to 6 increases interaction among the polymer, and thus decreases the bandgap.

Experimental Example 3

Evaluation of Light Absorption Characteristic

The electron-donating polymers according to Examples 1 to 6 and Comparative Examples 1 to 3 are respectively dissolved in dichlorobenzene, and the solution is dripped in a glass container. Next, the solvent is removed, obtaining a film. Then, Cary 5000 UV spectroscopy equipment made by Varian Inc. is used to obtain an ultraviolet-visible (UV-Vis) ray absorption spectrum of each film.

Figure 5:
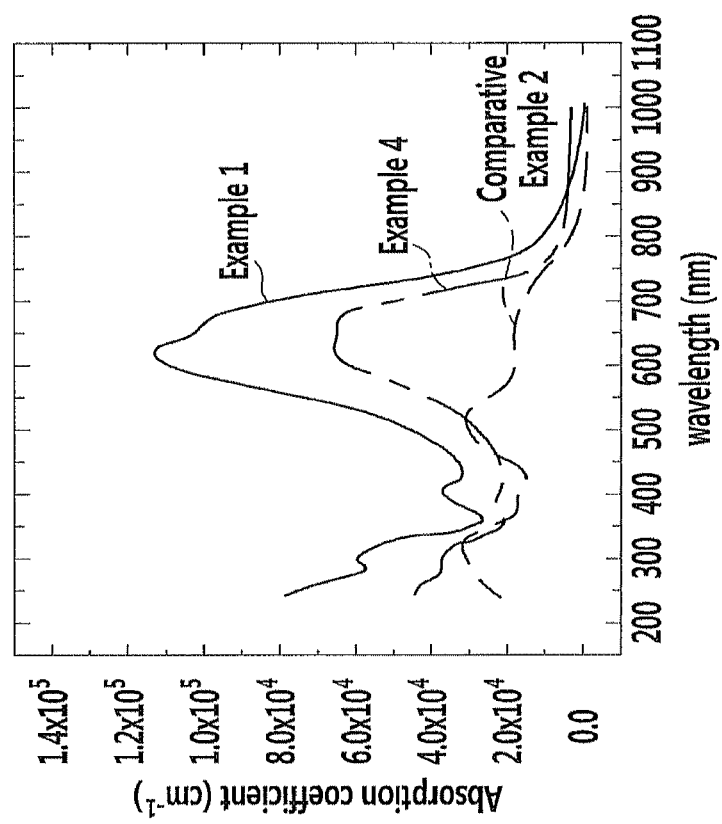
FIG. 5 shows ultraviolet-visible ray (UV-Vis) absorption spectra of the electron-donating polymers according to Example 1, Example 4, and Comparative Example 2.

FIG. 5 provides ultraviolet-visible (UV-Vis) ray absorption spectra of the electron-donating polymers according to Examples 1 and 4 and Comparative Example 2.

As shown in FIG. 5, the electron-donating polymer of Example 1 has a maximum absorption coefficient of $1.1 \times 10^5$ cm$^{-1}$, and the electron-donating polymer of Example 4 has a maximum absorption coefficient of $6.6 \times 10^4$ cm$^{-1}$. In addition, the electron-donating polymers according to Examples 1 and 4 are identified to sufficiently absorb light in a large wavelength region ranging from about 300 nm to about 800 nm.

On the other hand, the electron-donating polymer according to Comparative Example 2 has a maximum absorption coefficient of $3.5 \times 10^4$ cm$^{-1}$, and is identified to partly absorb light in a wavelength region ranging from about 400 nm to about 600 nm.

Resultantly, the electron-donating polymers according to Examples 1 and 4 have a relatively small bandgap and an improved light absorption characteristic.

Experimental Example 4

Solubility Evaluation of Organic Solvent

The electron-donating polymers according to Examples 1 to 6 and Comparative Examples 1 to 3 are respectively filtrated using a 0.5 μm filter, and evaluated regarding solubility of an organic solvent in a method of measuring the amount of a polymer in a solution. The results are provided in the following Table 2.

TABLE 2

|  | Solubility (mg/cc) |
|---|---|
| Example 1 | 12 |
| Example 2 | 11 |
| Example 3 | 12 |
| Example 4 | 11 |
| Example 5 | 14 |
| Example 6 | 11 |
| Comparative Example 2 | 0.2 |

As shown in Table 2, the electron-donating polymers according to Examples 1 to 6 have better solubility in an organic solvent than the electron-donating polymer of Comparative Example 2.

Experimental Example 5

Morphology Evaluation

Figure 6:
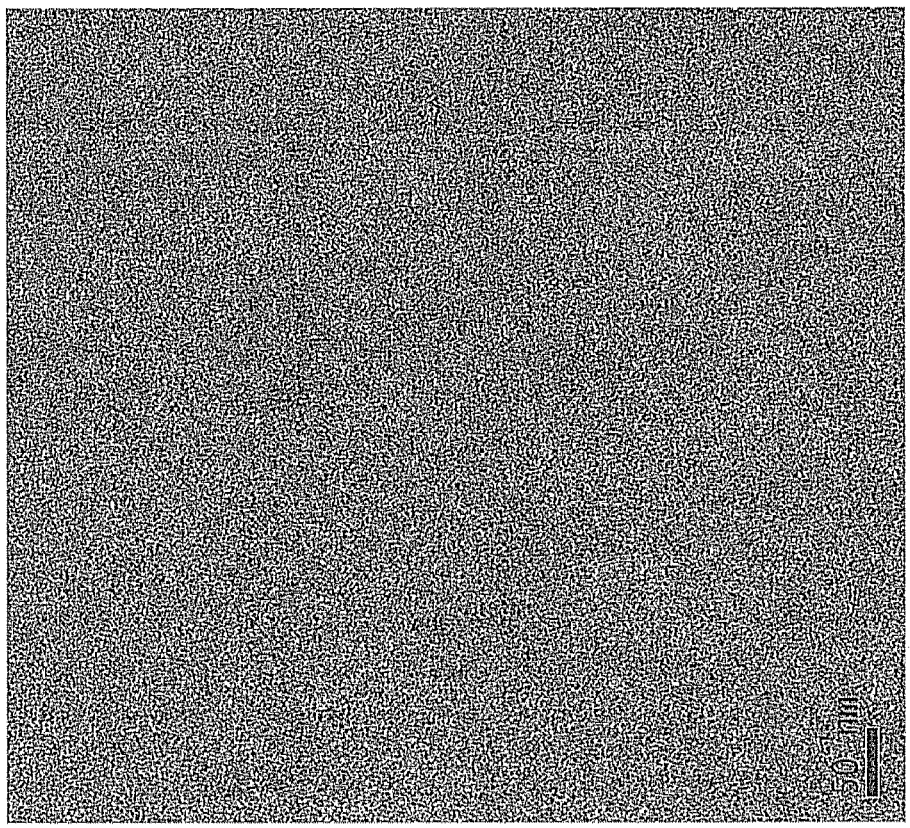
FIG. 6 is an image analysis photograph of a photoactive layer formed using the electron-donating polymer according to Example 1.
Figure 7:
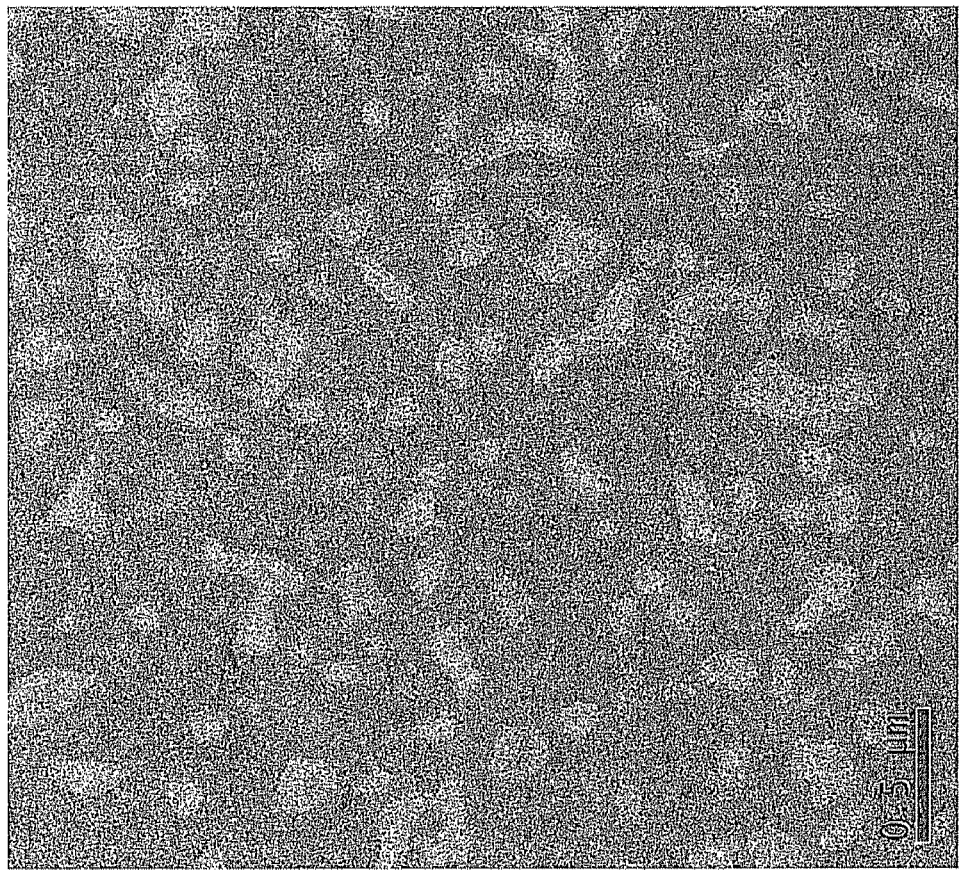
FIG. 7 is an image analysis photograph of a photoactive layer formed using the electron-donating polymer according to Comparative Example 2.

Each electron-donating polymer according to Examples 1 to 6 and Comparative Examples 1 to 3, and C71-PCBM, in a mole ratio of 1:1, is put in chlorobenzene, preparing a mixture. The mixture is spin-coated to form a 100 nm-thick photoactive layer on a glass substrate. Then, G2 F30 (TEC-NAI) equipment is used to obtain a TEM image of the photoactive layer, and the TEM image is analyzed. FIG. 6 provides the image analysis photograph of a photoactive layer formed by using the electron-donating polymer according to Example 1, and FIG. 7 shows the image analysis photograph of a photoactive layer formed by using the electron-donating polymer according to Comparative Example 2. The white parts in FIGS. 6 and 7 are C71-PCBM.

As shown in FIG. 6, when the photoactive layer is formed of the electron-donating polymer according to Example 1, C71-PCBM is uniformly-dispersed in the photoactive layer, showing improved morphology.

On the other hand, as shown in FIG. 7, when the photoactive layer is formed of the electron-donating polymer according to Comparative Example 2, C71-PCBM is not dispersed but is entangled in the photoactive layer, showing undesirable morphology.

When C71-PCBM is uniformly dispersed in the photoactive layers made of the electron-donating polymers according to Examples 1 to 6, a contact surface area between electron donors and electron acceptors may become larger, generating more current therebetween, and resultantly improving photoelectric conversion efficiency of a solar cell.

Experimental Example 6

Hole Mobility Measurement

The solar cells according to Examples 7 to 12 and Comparative Examples 4 to 6 are respectively measured regarding carrier concentration change depending on voltage change by using a customized (vertical beam direction) 300W Solar Simulator (Newport Co.) and Keithley 2400 (Keithley Instruments Inc.) equipment.

Figure 8:
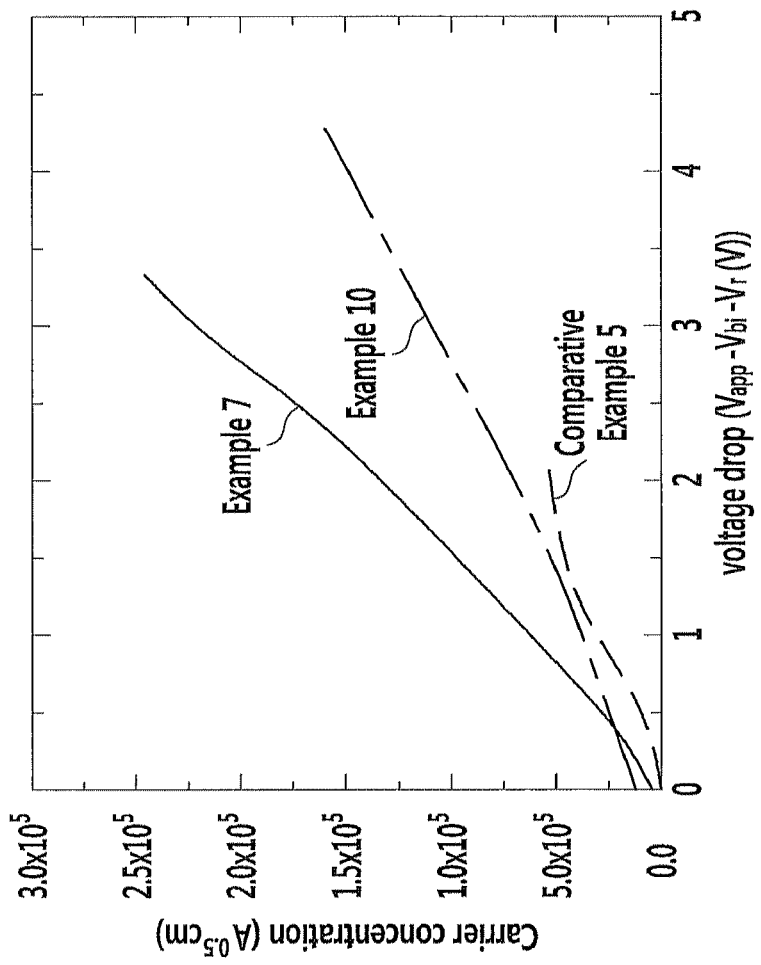
FIG. 8 is a graph showing carrier concentration changes vs. voltage of the solar cells according to Example 7, Example 10, and Comparative Example 5.

FIG. 8 is a graph showing carrier concentration change measurements of the solar cells according to Examples 7 and 10 and Comparative Example 5 depending on voltage change.

In FIG. 8, the horizontal axis indicates a voltage drop across the device represented by the equation $V=V_{app}-V_{bi}-V_r$. Herein, $V_{app}$ indicates an applied voltage, $V_{bi}$ indicates a built-in voltage, and $V_r$ indicates a voltage drop due to series resistance.

In FIG. 8, the vertical axis indicates a carrier concentration represented by the equation $J^{0.5}L^{1.5}$ ($A^{0.5}$ cm). Herein, J indicates space charge limit current density, and L indicates polymer thickness. The solar cells may be evaluated regarding hole mobility by measuring the slope of each curve.

As shown in FIG. 8, the solar cell of Example 7 has hole mobility of $1.8 \times 10^{-4}$ cm²/V·s, the solar cell of Example 10 has hole mobility of $3.8 \times 10^{-5}$ cm²/V·s, and the solar cell of Comparative Example 5 has hole mobility of $2.8 \times 10^{-5}$ cm²/V·s. In other words, the solar cells of Examples 7 and 10 are identified to have improved hole mobility compared with the solar cell of Comparative Example 5.

Experimental Example 7

Solar Cell Efficiency Evaluation

Figure 9:
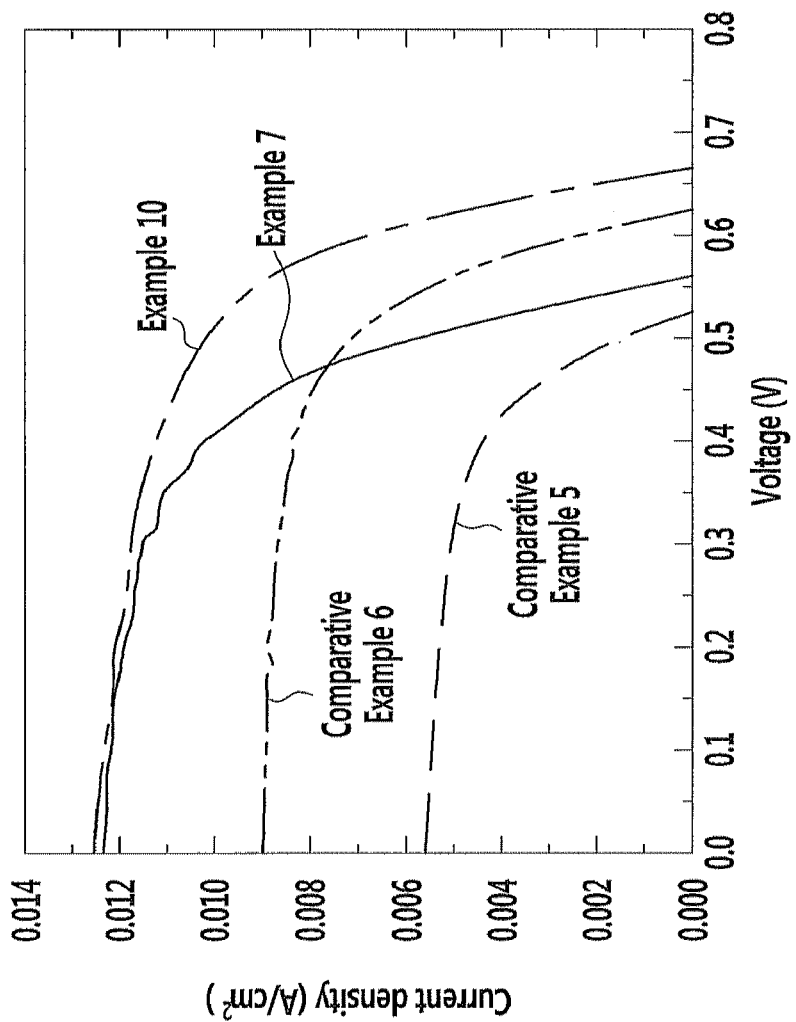
FIG. 9 shows I-V curves of solar cells according to Example 7, Example 10, Comparative Example 5, and Comparative Example 6.

The solar cells according to Examples 7 to 12 and Comparative Examples 4 to 6 are respectively evaluated regarding I-V curves by using a customized (vertical beam direction) 300W Solar Simulator (Newport Co.) and Keithley 2400 (Keithley Inc.) equipment. FIG. 9 shows I-V curves of the solar cells according to Examples 7 and 10 and Comparative Examples 5 and 6.

Table 3 provides maximum current density, maximum voltage, fill factor (FF), and photoelectric conversion efficiency acquired from the I-V curves.

TABLE 3

|  | Current density (mA/cm²) | Voltage (mV) | Fill factor (%) | Photoelectric conversion efficiency (%) |
|---|---|---|---|---|
| Example 7 | 12.4 | 557.6 | 59.0 | 4.10 |
| Example 10 | 13.4 | 658.6 | 63.5 | 5.61 |
| Comparative Example 5 | 5.6 | 527.2 | 59.6 | 1.76 |
| Comparative Example 6 | 9.0 | 628.3 | 63.7 | 3.60 |

As shown in Table 3, the solar cells of Examples 7 and 10 have improved photoelectric conversion efficiency compared with the solar cells of Comparative Examples 5 and 6.

While this disclosure has been described in connection with what is presently considered to be example embodiments, it is to be understood that the inventive concepts are not limited to the disclosed embodiments, but, on the contrary, is intended to cover various modifications and equivalent arrangements included within the spirit and scope of the appended claims.

What is claimed is:

1. An electron-donating polymer, comprising:
a repeating unit A comprising a repeating unit according to Chemical Formula 3 and at least one selected from a repeating unit according to Chemical Formula 1, a repeating unit according to Chemical Formula 2, and a combination thereof; and
a repeating unit B comprising a repeating unit according to Chemical Formula 4 and a repeating unit according to Chemical Formula 5:

[Chemical Formula 1]

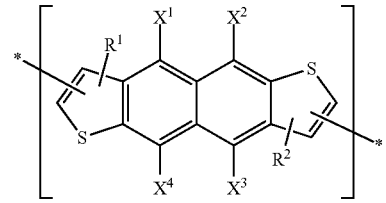

[Chemical Formula 2]

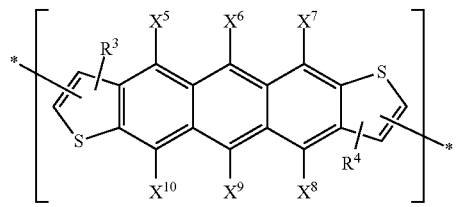

wherein, in Chemical Formulae 1 and 2,
$X^1$ to $X^{10}$ are one of same and different, and each of $X^1$ to $X^{10}$ are independently one of hydrogen, a halogen, a substituted or unsubstituted $C_1$ to $C_{20}$ aliphatic organic group, a hydroxyl group, a substituted or unsubstituted $C_1$ to $C_{20}$ alkoxy group, a substituted or unsubstituted $C_1$ to $C_{20}$ ester group, a thiol group, or —SR$^{100}$, wherein R$^{100}$ is a substituted or unsubstituted $C_1$ to $C_{20}$ aliphatic organic group, a substituted or unsubstituted $C_2$ to $C_{30}$ aromatic organic group, and a substituted or unsubstituted $C_2$ to $C_{30}$ heterocycloalkyl group,
$R^1$ to $R^4$ are one of same and different, and each of $R^1$ to $R^4$ are independently one of hydrogen, a substituted or unsubstituted $C_1$ to $C_{20}$ linear or branched alkyl group, a substituted or unsubstituted $C_3$ to $C_{20}$ cycloalkyl group, a substituted or unsubstituted $C_1$ to $C_{20}$ alkoxy group, a substituted or unsubstituted $C_6$ to $C_{30}$ aryl group, a substituted or unsubstituted $C_2$ to $C_{30}$ heteroaryl group, and a combination thereof, or optionally at least one of CH$_2$ groups of $R^1$ to $R^4$ is substituted with —O—, —S—, —SO$_2$—, —CO—, —OCO—, —COO—, —CH═CH—, —C≡C—, or —SiR$^{101}$R$^{102}$—, wherein R$^{101}$ and R$^{102}$ are one of same and different, and each of R$^{101}$ and R$^{102}$ are independently one of hydrogen, a substituted or unsubstituted $C_1$ to $C_{20}$ linear or branched alkyl group, a substituted or unsubstituted $C_3$ to $C_{20}$ cycloalkyl group, a substituted or unsubstituted $C_1$ to $C_{20}$ alkoxy group, a substituted or unsubstituted $C_6$ to $C_{30}$ aryl group, a substituted or unsubstituted $C_2$ to $C_{30}$ heteroaryl group, and a combination thereof,

[Chemical Formula 3]

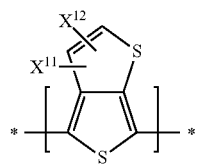

wherein, in Chemical Formula 3, $X^{11}$ and $X^{12}$ are one of same or different, and each of $X^{11}$ and $X^{12}$ are independently one of hydrogen, a halogen, a substituted or unsubstituted $C_1$ to $C_{20}$ aliphatic organic group, a hydroxyl group, a substituted or unsubstituted $C_1$ to $C_{20}$ alkoxy group, a substituted or unsubstituted $C_1$ to $C_{20}$ ester group, a thiol group, or $-SR^{103}$, wherein $R^{103}$ is a substituted or unsubstituted $C_1$ to $C_{20}$ aliphatic organic group, a substituted or unsubstituted $C_2$ to $C_{30}$ aromatic organic group, and a substituted or unsubstituted $C_2$ to $C_{30}$ heterocycloalkyl group,

[Chemical Formula 4]

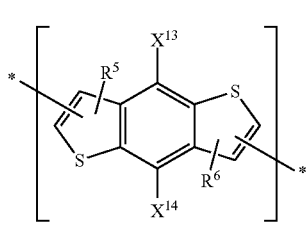

wherein, in Chemical Formula 4, $X^{13}$ and $X^{14}$ are one of same and different, and each one of $X^{13}$ and $X^{14}$ are independently one of hydrogen, a halogen, a substituted or unsubstituted $C_1$ to $C_{20}$ aliphatic organic group, a hydroxyl group, a substituted or unsubstituted $C_1$ to $C_{20}$ alkoxy group, a substituted or unsubstituted $C_1$ to $C_{20}$ ester group, a thiol group, and $-SR^{104}$, wherein $R^{104}$ is one of a substituted or unsubstituted $C_1$ to $C_{20}$ aliphatic organic group, a substituted or unsubstituted $C_2$ to $C_{30}$ aromatic organic group, and a substituted or unsubstituted $C_2$ to $C_{30}$ heterocycloalkyl group, $R^5$ and $R^6$ are one of same and different, and each of $R^5$ and $R^6$ are independently one of hydrogen, a substituted or unsubstituted $C_1$ to $C_{20}$ linear or branched alkyl group, a substituted or unsubstituted $C_3$ to $C_{20}$ cycloalkyl group, a substituted or unsubstituted $C_1$ to $C_{20}$ alkoxy group, a substituted or unsubstituted $C_6$ to $C_{30}$ aryl group, a substituted or unsubstituted $C_2$ to $C_{30}$ heteroaryl group, and a combination thereof, or optionally at least one of $CH_2$ groups of $R^5$ and $R^6$ is substituted with one of $-O-$, $-S-$, $-SO_2-$, $-CO-$, $-OCO-$, $-COO-$, $-CH=CH-$, $-C\equiv C-$, and $-SiR^{105}R^{106}-$, wherein $R^{105}$ and $R^{106}$ are one of same and different, and each of $R^{105}$ and $R^{106}$ are independently one of hydrogen, a substituted or unsubstituted $C_1$ to $C_{20}$ linear or branched alkyl group, a substituted or unsubstituted $C_3$ to $C_{20}$ cycloalkyl group, a substituted or unsubstituted $C_1$ to $C_{20}$ alkoxy group, a substituted or unsubstituted $C_6$ to $C_{30}$ aryl group, a substituted or unsubstituted $C_2$ to $C_{30}$ heteroaryl group, and a combination thereof,

[Chemical Formula 5]

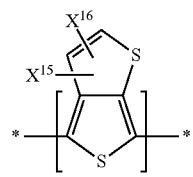

wherein, in Chemical Formula 5, $X^{15}$ and $X^{16}$ are one of same and different, and each of $X^{15}$ and $X^{16}$ are independently one of hydrogen, a halogen, a substituted or unsubstituted $C_1$ to $C_{20}$ aliphatic organic group, a hydroxyl group, a substituted or unsubstituted $C_1$ to $C_{20}$ alkoxy group, a substituted or unsubstituted $C_1$ to $C_{20}$ ester group, a thiol group, and $-SR^{107}$, wherein $R^{107}$ is one of a substituted or unsubstituted $C_1$ to $C_{20}$ aliphatic organic group, a substituted or unsubstituted $C_2$ to $C_{30}$ aromatic organic group, and a substituted or unsubstituted $C_2$ to $C_{30}$ heterocycloalkyl group, wherein in Chemical Formula 3, $X^{11}$ and $X^{12}$ are not a $C_1$ to $C_{20}$ alkyl group substituted with a halogen, and in Chemical Formula 5, $X^{15}$ and $X^{16}$ are not a $C_1$ to $C_{20}$ alkyl group substituted with a halogen.

2. The electron-donating polymer of claim 1, wherein, in Chemical Formulae 1 and 2, $X^1$ to $X^4$ are one of same and different, and each of $X^1$ to $X^4$ are independently one of hydrogen, a substituted or unsubstituted $C_1$ to $C_{20}$ alkyl group, a substituted or unsubstituted $C_1$ to $C_{20}$ alkoxy group, and a substituted or unsubstituted $C_1$ to $C_{20}$ ester group, provided that at least one of $X^1$ to $X^4$ is one of a substituted or unsubstituted $C_1$ to $C_{20}$ alkyl group, a substituted or unsubstituted $C_1$ to $C_{20}$ alkoxy group, and a substituted or unsubstituted $C_1$ to $C_{20}$ ester group, $X^5$ to $X^{10}$ are one of same and different, and each of $X^5$ to $X^{10}$ are independently one of hydrogen, a substituted or unsubstituted $C_1$ to $C_{20}$ alkyl group, a substituted or unsubstituted $C_1$ to $C_{20}$ alkoxy group, and a substituted or unsubstituted $C_1$ to $C_{20}$ ester group, provided that at least one of $X^5$ to $X^{10}$ is one of a substituted or unsubstituted $C_1$ to $C_{20}$ alkyl group, a substituted or unsubstituted $C_1$ to $C^{20}$ alkoxy group, and a substituted or unsubstituted $C_1$ to $C_{20}$ ester group, $R^1$ to $R^4$ are one of same and different, and each of $R^1$ to $R^4$ are independently one of hydrogen and a substituted or unsubstituted $C_1$ to $C_{20}$ alkyl group, and the repeating unit according to Chemical Formula 3 comprises at least one selected from a repeating unit according to Chemical Formula 3-1, a repeating unit according to Chemical Formula 3-2, and a combination thereof,

[Chemical Formula 3-1]

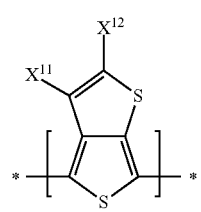

-continued

[Chemical Formula 3-2]

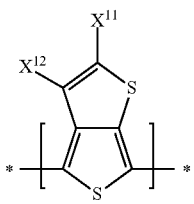

wherein, in Chemical Formulae 3-1 and 3-2,
each $X^{11}$ are one of same and different in each repeating unit, and each $X^{11}$ is independently one of hydrogen and a halogen, and
each $X^{12}$ are one of same and different in each repeating unit, and each $X^{12}$ is independently one of a substituted or unsubstituted $C_1$ to $C_{20}$ alkyl group, a substituted or unsubstituted $C_1$ to $C_{20}$ alkoxy group, and a substituted or unsubstituted $C_1$ to $C_{20}$ ester group.

3. The electron-donating polymer of claim 2, wherein $X^1$ to $X^{10}$ are one of same and different, and each $X^1$ to $X^{10}$ are independently one of hydrogen and a substituted or unsubstituted $C_1$ to $C_{20}$ alkoxy group, at least one of $X^1$ to $X^4$ is a substituted or unsubstituted $C_1$ to $C_{20}$ alkoxy group, and at least one of $X^5$ to $X^{10}$ is a substituted or unsubstituted $C_1$ to $C_{20}$ alkoxy group,
$R^1$ to $R^4$ are hydrogen,
each $X^{11}$ are one of same and different in each repeating unit, and each $X^{11}$ are independently one of hydrogen and a halogen, and
each $X^{12}$ are one of same and different in each repeating unit, and each $X^{12}$ are independently a substituted or unsubstituted $C_1$ to $C_{20}$ ester group.

4. An electron-donating polymer, comprising:
a repeating unit A comprising a repeating unit according to Chemical Formula 3 and at least one selected from a repeating unit according to Chemical Formula 1, a repeating unit according to Chemical Formula 2, and a combination thereof; and
a repeating unit B comprising a repeating unit according to Chemical Formula 4 and a repeating unit according to Chemical Formula 5:

[Chemical Formula 1]

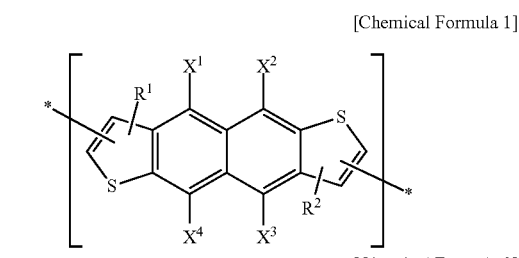

[Chemical Formula 2]

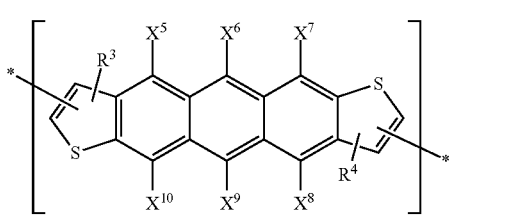

wherein, in Chemical Formulae 1 and 2,
$X^1$ to $X^{10}$ are one of same and different, and each of $X^1$ to $X^{10}$ are independently one of hydrogen, a halogen, a substituted or unsubstituted $C_1$ to $C_{20}$ aliphatic organic group, a hydroxyl group, a substituted or unsubstituted $C_1$ to $C_{20}$ alkoxy group, a substituted or unsubstituted $C_1$ to $C_{20}$ ester group, a thiol group, or —$SR^{100}$, wherein $R^{100}$ is a substituted or unsubstituted $C_1$ to $C_{20}$ aliphatic organic group, a substituted or unsubstituted $C_2$ to $C_{30}$ aromatic organic group, and a substituted or unsubstituted $C_2$ to $C_{30}$ heterocycloalkyl group,
$R^1$ to $R^4$ are one of same and different, and each of $R^1$ to $R^4$ are independently one of hydrogen, a substituted or unsubstituted $C_1$ to $C_{20}$ linear or branched alkyl group, a substituted or unsubstituted $C_3$ to $C_{20}$ cycloalkyl group, a substituted or unsubstituted $C_1$ to $C_{20}$ alkoxy group, a substituted or unsubstituted $C_6$ to $C_{30}$ aryl group, a substituted or unsubstituted $C_2$ to $C_{30}$ heteroaryl group, and a combination thereof, or optionally at least one of $CH_2$ groups of $R^1$ to $R^4$ is substituted with —O—, —S—, —$SO_2$—, —CO—, —OCO—, —COO—, —CH=CH—, —C≡C—, or —$SiR^{101}R^{102}$—, wherein $R^{101}$ and $R^{102}$ are one of same and different, and each of $R^{101}$ and $R^{102}$ are independently one of hydrogen, a substituted or unsubstituted $C_1$ to $C_{20}$ linear or branched alkyl group, a substituted or unsubstituted $C_3$ to $C_{20}$ cycloalkyl group, a substituted or unsubstituted $C_1$ to $C_{20}$ alkoxy group, a substituted or unsubstituted $C_6$ to $C_{30}$ aryl group, a substituted or unsubstituted $C_2$ to $C_{30}$ heteroaryl group, and a combination thereof,

[Chemical Formula 3-1]

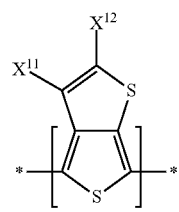

[Chemical Formula 3-2]

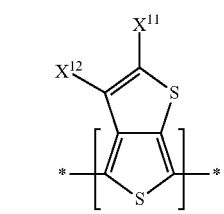

wherein, in Chemical Formula 3,
$X^{11}$ and $X^{12}$ are one of same or different, and each of $X^{11}$ and $X^{12}$ are independently one of hydrogen, a halogen, a substituted or unsubstituted $C_1$ to $C_{20}$ aliphatic organic group, a hydroxyl group, a substituted or unsubstituted $C_1$ to $C_{20}$ alkoxy group, a substituted or unsubstituted $C_1$ to $C_{20}$ ester group, a thiol group, or —$SR^{103}$, wherein $R^{103}$ is a substituted or unsubstituted $C_1$ to $C_{20}$ aliphatic organic group, a substituted or unsubstituted $C_2$ to $C_{30}$ aromatic organic group, and a substituted or unsubstituted $C_2$ to $C_{30}$ heterocycloalkyl group,

[Chemical Formula 4]

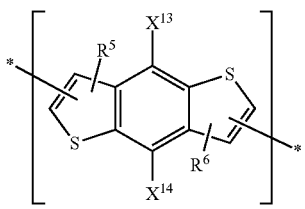

wherein, in Chemical Formula 4, $X^{13}$ and $X^{14}$ are one of same and different, and each one of $X^{13}$ and $X^{14}$ are independently one of hydrogen, a halogen, a substituted or unsubstituted $C_1$ to $C_{20}$ aliphatic organic group, a hydroxyl group, a substituted or unsubstituted $C_1$ to $C_{20}$ alkoxy group, a substituted or unsubstituted $C_1$ to $C_{20}$ ester group, a thiol group, and $-SR^{104}$, wherein $R^{104}$ is one of a substituted or unsubstituted $C_1$ to $C_{20}$ aliphatic organic group, a substituted or unsubstituted $C_2$ to $C_{30}$ aromatic organic group, and a substituted or unsubstituted $C_2$ to $C_{30}$ heterocycloalkyl group, $R^5$ and $R^6$ are one of same and different, and each of $R^5$ and $R^6$ are independently one of hydrogen, a substituted or unsubstituted $C_1$ to $C_{20}$ linear or branched alkyl group, a substituted or unsubstituted $C_3$ to $C_{20}$ cycloalkyl group, a substituted or unsubstituted $C_1$ to $C_{20}$ alkoxy group, a substituted or unsubstituted $C_6$ to $C_{30}$ aryl group, a substituted or unsubstituted $C_2$ to $C_{30}$ heteroaryl group, and a combination thereof, or optionally at least one of $CH_2$ groups of $R^5$ and $R^6$ is substituted with one of $-O-$, $-S-$, $-SO_2-$, $-CO-$, $-OCO-$, $-COO-$, $-CH=CH-$, $-C\equiv C-$, and $-SiR^{105}R^{106}-$, wherein $R^{105}$ and $R^{106}$ are one of same and different, and each of $R^{105}$ and $R^{106}$ are independently one of hydrogen, a substituted or unsubstituted $C_1$ to $C_{20}$ linear or branched alkyl group, a substituted or unsubstituted $C_3$ to $C_{20}$ cycloalkyl group, a substituted or unsubstituted $C_1$ to $C_{20}$ alkoxy group, a substituted or unsubstituted $C_6$ to $C_{30}$ aryl group, a substituted or unsubstituted $C_2$ to $C_{30}$ heteroaryl group, and a combination thereof,

[Chemical Formula 5]

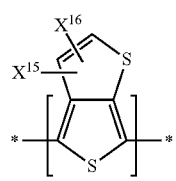

wherein, in Chemical Formula 5, $X^{15}$ and $X^{16}$ are one of same and different, and each of $X^{15}$ and $X^{16}$ are independently one of hydrogen, a halogen, a substituted or unsubstituted $C_1$ to $C_{20}$ aliphatic organic group, a hydroxyl group, a substituted or unsubstituted $C_1$ to $C_{20}$ alkoxy group, a substituted or unsubstituted $C_1$ to $C_{20}$ ester group, a thiol group, and $-SR^{107}$, wherein $R^{107}$ is one of a substituted or unsubstituted $C_1$ to $C_{20}$ aliphatic organic group, a substituted or unsubstituted $C_2$ to $C_{30}$ aromatic organic group, and a substituted or unsubstituted $C_2$ to $C_{30}$ heterocycloalkyl group, wherein, in Chemical Formula 4, $X^{13}$ and $X^{14}$ are one of same and different, and each of $X^{13}$ and $X^{14}$ are independently one of a substituted or unsubstituted $C_1$ to $C_{20}$ alkyl group, a substituted or unsubstituted $C_1$ to $C_{20}$ alkoxy group, a substituted or unsubstituted $C_1$ to $C_{20}$ ester group, and $-SR^{104}$, wherein $R^{104}$ is a substituted or unsubstituted $C_1$ to $C_{20}$ alkyl group, $R^5$ and $R^6$ are one of same and different, and each of $R^5$ and $R^6$ are independently one of hydrogen and a substituted or unsubstituted $C_1$ to $C_{20}$ alkyl group, and the repeating unit according to Chemical Formula 5 comprises at least one selected from a repeating unit according to Chemical Formula 5-1, a repeating unit according to Chemical Formula 5-2, and a combination thereof,

[Chemical Formula 5-1]

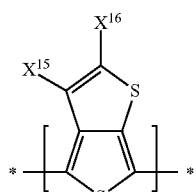

[Chemical Formula 5-2]

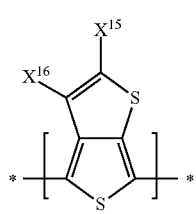

wherein, in Chemical Formulae 5-1 and 5-2, each $X^{15}$ are one of same and different in each repeating unit, and each $X^{15}$ are independently one of hydrogen and a halogen, and each $X^{16}$ are one of same and different in each repeating unit, and each $X^{16}$ are independently one of a substituted or unsubstituted $C_1$ to $C_{20}$ alkyl group, a substituted or unsubstituted $C_1$ to $C_{20}$ alkoxy group, and a substituted or unsubstituted $C_1$ to $C_{20}$ ester group.

5. The electron-donating polymer of claim 4, wherein $X^{13}$ and $X^{14}$ are one of same and different, and each $X^{13}$ and $X^{14}$ are independently a substituted or unsubstituted $C_1$ to $C_{20}$ alkoxy group, $R^5$ and $R^6$ are hydrogen, each $X^{15}$ are one of same and different in each repeating unit, and each $X^{15}$ are independently one of hydrogen and a halogen, and each $X^{16}$ are one of same and different in each repeating unit, and each $X^{16}$ are independently a substituted or unsubstituted $C_1$ to $C_{20}$ ester group.

6. The electron-donating polymer of claim 1, wherein the repeating unit A comprises a repeating unit according to Chemical Formula 11, and the repeating unit B comprises a repeating unit according to Chemical Formula 12:

[Chemical Formula 11]

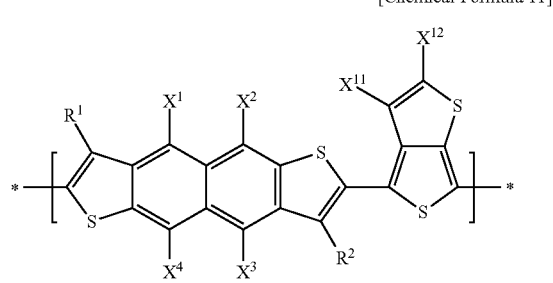

wherein, in Chemical Formula 11, $X^1$ to $X^4$ are one of same and different, and each of $X^1$ to $X^4$ are independently one of hydrogen, a substituted or unsubstituted $C_1$ to $C_{20}$ alkyl group, a substituted or unsubstituted $C_1$ to $C_{20}$ alkoxy group, and a substituted or unsubstituted $C_1$ to $C_{20}$ ester group, provided that at least one of $X^1$ to $X^4$ is one of a substituted or unsubstituted $C_1$ to $C_{20}$ alkyl group, a substituted or unsubstituted $C_1$ to $C_{20}$ alkoxy group, and a substituted or unsubstituted $C_1$ to $C_{20}$ ester group, each $X^{11}$ are one of same and different in each repeating unit, and each $X^{11}$ are independently one of hydrogen and a halogen, each $X^{12}$ are one of same and different in each repeating unit, and each $X^{12}$ are independently one of a substituted or unsubstituted $C_1$ to $C_{20}$ alkyl group, a substituted or unsubstituted $C_1$ to $C_{20}$ alkoxy group, and a substituted or unsubstituted $C_1$ to $C_{20}$ ester group, $X^{12}$ is not a C1 to C20 alkyl group substituted with a halogen, and $R^1$ and $R^2$ are one of same and different, and each of $R^1$ and $R^2$ are independently one of hydrogen and a substituted or unsubstituted $C_1$ to $C_{20}$ alkyl group,

[Chemical Formula 12]

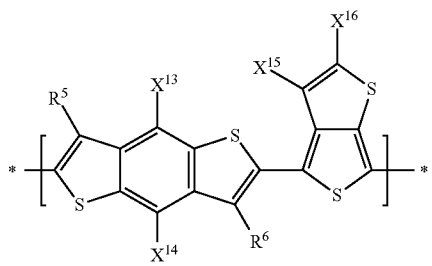

wherein, in Chemical Formula 12, $X^{13}$ and $X^{14}$ are one of same and different, and each of $X^{13}$ and $X^{14}$ are independently one of a substituted or unsubstituted $C_1$ to $C_{20}$ alkyl group, a substituted or unsubstituted $C_1$ to $C_{20}$ alkoxy group, a substituted or unsubstituted $C_1$ to $C_{20}$ ester group, and —$SR^{104}$, wherein $R^{104}$ is a substituted or unsubstituted $C_1$ to $C_{20}$ alkyl group, each $X^{15}$ are one of same and different in each repeating unit, and each $X^{15}$ are independently one of hydrogen and a halogen, each $X^{16}$ are one of same and different in each repeating unit, and each $X^{16}$ are independently one of a substituted or unsubstituted $C_1$ to $C_{20}$ alkyl group, a substituted or unsubstituted $C_1$ to $C_{20}$ alkoxy group, and a substituted or unsubstituted $C_1$ to $C_{20}$ ester group, each $R^5$ and $R^6$ are one of same and different, and each $R^5$ and $R^6$ are independently one of hydrogen and a substituted or unsubstituted $C_1$ to $C_{20}$ alkyl group, and $X^{16}$ is not a C1 to C20 alkyl group substituted with a halogen.

7. The electron-donating polymer of claim 6, wherein $X^1$ to $X^4$ are one of same and different, and each $X^1$ to $X^4$ are independently one of hydrogen and a substituted or unsubstituted $C_1$ to $C_{20}$ alkoxy group, and at least one of $X^1$ to $X^4$ is a substituted or unsubstituted $C_1$ to $C_{20}$ alkoxy group, $X^{13}$ and $X^{14}$ are one of same and different, and each $X^{13}$ and $X^{14}$ are independently a substituted or unsubstituted $C_1$ to $C_{20}$ alkoxy group, $R^1$, $R^2$, $R^5$, and $R^6$ are hydrogen, $X^{11}$ and $X^{15}$ are one of same and different, and each of $X^{11}$ and $X^{15}$ are independently one of hydrogen and a halogen, and $X^{12}$ and $X^{16}$ are one of same and different, and each of $X^{12}$ and $X^{16}$ are independently a substituted or unsubstituted $C_1$ to $C_{20}$ ester group.

8. An electron-donating polymer, comprising:

a repeating unit A comprising a repeating unit according to Chemical Formula 3 and at least one selected from a repeating unit according to Chemical Formula 1, a repeating unit according to Chemical Formula 2, and a combination thereof; and a repeating unit B comprising a repeating unit according to Chemical Formula 4 and a repeating unit according to Chemical Formula 5:

[Chemical Formula 1]

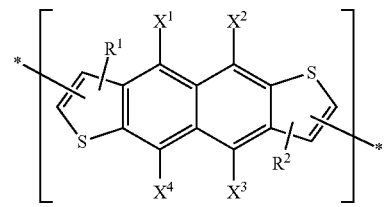

[Chemical Formula 2]

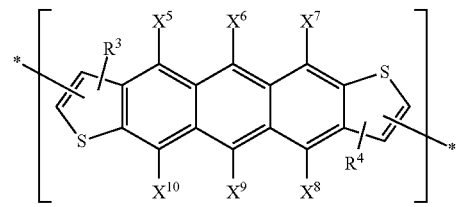

wherein, in Chemical Formulae 1 and 2, $X^1$ to $X^{10}$ are one of same and different, and each of $X^1$ to $X^{10}$ are independently one of hydrogen, a halogen, a substituted or unsubstituted $C_1$ to $C_{20}$ aliphatic organic group, a hydroxyl group, a substituted or unsubstituted $C_1$ to $C_{20}$ alkoxy group, a substituted or unsubstituted $C_1$ to $C_{20}$ ester group, a thiol group, or —$SR^{100}$, wherein $R^{100}$ is a substituted or unsubstituted $C_1$ to $C_{20}$ aliphatic organic group, a substituted or unsubstituted $C_2$ to $C_{30}$ aromatic organic group, and a substituted or unsubstituted $C_2$ to $C_{30}$ heterocycloalkyl group, $R^1$ to $R^4$ are one of same and different, and each of $R^1$ to $R^4$ are independently one of hydrogen, a substituted or unsubstituted $C_1$ to $C_{20}$ linear or branched alkyl group, a substituted or unsubstituted $C_3$ to $C_{20}$ cycloalkyl group, a substituted or unsubstituted $C_1$ to $C_{20}$ alkoxy group, a substituted or unsubstituted $C_6$ to $C_{30}$ aryl group, a substituted or unsubstituted $C_2$ to $C_{30}$ heteroaryl group, and a combination thereof, or optionally at least one of $CH_2$ groups of $R^1$ to $R^4$ is substituted with —O—, —S—, —$SO_2$—, —CO—, —OCO—, —COO—, —CH=CH—, —C≡C—, or —$SiR^{101}R^{102}$—, wherein $R^{101}$ and $R^{102}$ are one of same and different, and each of $R^{101}$ and $R^{102}$ are independently one of hydrogen, a substituted or unsubstituted $C_1$ to $C_{20}$ linear or branched alkyl group, a substituted or unsubstituted $C_3$ to $C_{20}$ cycloalkyl group, a substituted or unsubstituted $C_1$ to $C_{20}$ alkoxy group, a substituted or unsubstituted $C_6$ to $C_{30}$ aryl group, a substituted or unsubstituted $C_2$ to $C_{30}$ heteroaryl group, and a combination thereof,

[Chemical Formula 3]

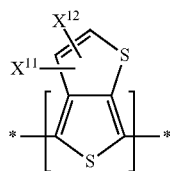

wherein, in Chemical Formula 3, $X^{11}$ and $X^{12}$ are one of same or different, and each of $X^{11}$ and $X^{12}$ are independently one of hydrogen, a halogen, a substituted or unsubstituted $C_1$ to $C_{20}$ aliphatic organic group, a hydroxyl group, a substituted or unsubstituted $C_1$ to $C_{20}$ alkoxy group, a substituted or unsubstituted $C_1$ to $C_{20}$ ester group, a thiol group, or —$SR^{103}$, wherein $R^{103}$ is a substituted or unsubstituted $C_1$ to $C_{20}$ aliphatic organic group, a substituted or unsubstituted $C_2$ to $C_{30}$ aromatic organic group, and a substituted or unsubstituted $C_2$ to $C_{30}$ heterocycloalkyl group,

[Chemical Formula 4]

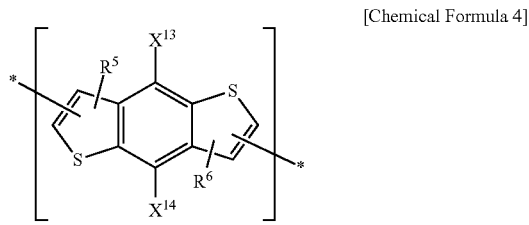

wherein, in Chemical Formula 4, $X^{13}$ and $X^{14}$ are one of same and different, and each one of $X^{13}$ and $X^{14}$ are independently one of hydrogen, a halogen, a substituted or unsubstituted $C_1$ to $C_{20}$ aliphatic organic group, a hydroxyl group, a substituted or unsubstituted $C_1$ to $C_{20}$ alkoxy group, a substituted or unsubstituted $C_1$ to $C_{20}$ ester group, a thiol group, and —$SR^{104}$, wherein $R^{104}$ is one of a substituted or unsubstituted $C_1$ to $C_{20}$ aliphatic organic group, a substituted or unsubstituted $C_2$ to $C_{30}$ aromatic organic group, and a substituted or unsubstituted $C_2$ to $C_{30}$ heterocycloalkyl group, $R^5$ and $R^6$ are one of same and different, and each of $R^5$ and $R^6$ are independently one of hydrogen, a substituted or unsubstituted $C_1$ to $C_{20}$ linear or branched alkyl group, a substituted or unsubstituted $C_3$ to $C_{20}$ cycloalkyl group, a substituted or unsubstituted $C_1$ to $C_{20}$ alkoxy group, a substituted or unsubstituted $C_6$ to $C_{30}$ aryl group, a substituted or unsubstituted $C_2$ to $C_{30}$ heteroaryl group, and a combination thereof, or optionally at least one of $CH_2$ groups of $R^5$ and $R^6$ is substituted with one of —O—, —S—, —$SO_2$—, —CO—, —OCO—, —COO—, —CH=CH—, —C≡C—, and —$SiR^{105}R^{106}$—, wherein $R^{105}$ and $R^{106}$ are one of same and different, and each of $R^{105}$ and $R^{106}$ are independently one of hydrogen, a substituted or unsubstituted $C_1$ to $C_{20}$ linear or branched alkyl group, a substituted or unsubstituted $C_3$ to $C_{20}$ cycloalkyl group, a substituted or unsubstituted $C_1$ to $C_{20}$ alkoxy group, a substituted or unsubstituted $C_6$ to $C_{30}$ aryl group, a substituted or unsubstituted $C_2$ to $C_{30}$ heteroaryl group, and a combination thereof,

[Chemical Formula 5]

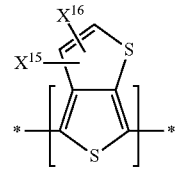

wherein, in Chemical Formula 5, $X^{15}$ and $X^{16}$ are one of same and different, and each of $X^{15}$ and $X^{16}$ are independently one of hydrogen, a halogen, a substituted or unsubstituted $C_1$ to $C_{20}$ aliphatic organic group, a hydroxyl group, a substituted or unsubstituted $C_1$ to $C_{20}$ alkoxy group, a substituted or unsubstituted $C_1$ to $C_{20}$ ester group, a thiol group, and —$SR^{107}$, wherein $R^{107}$ is one of a substituted or unsubstituted $C_1$ to $C_{20}$ aliphatic organic group, a substituted or unsubstituted $C_2$ to $C_{30}$ aromatic organic group, and a substituted or unsubstituted $C_2$ to $C_{30}$ heterocycloalkyl group, wherein the repeating unit A comprises a repeating unit according to Chemical Formula 13, and the repeating unit B comprises a repeating unit according to Chemical Formula 12:

[Chemical Formula 13]

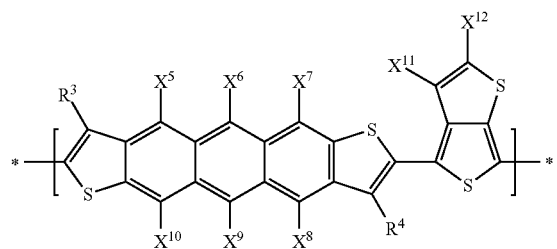

wherein, in Chemical Formula 13, $X^5$ to $X^{10}$ are one of same and different, and each $X^5$ to $X^{10}$ are independently one of hydrogen, a substituted or unsubstituted $C_1$ to $C_{20}$ alkyl group, a substituted or unsubstituted $C_1$ to $C_{20}$ alkoxy group, and a substituted or unsubstituted $C_1$ to $C_{20}$ ester group, provided that at least one of $X^5$ to $X^{10}$ is one of a substituted or unsubstituted $C_1$ to $C_{20}$ alkyl group, a substituted or unsubstituted $C_1$ to $C_{20}$ alkoxy group, and a substituted or unsubstituted $C_1$ to $C_{20}$ ester group, each $X^{11}$ are one of same and different in each repeating unit, and each $X^{11}$ are independently one of hydrogen and a halogen, each $X^{12}$ are one of same and different in each repeating unit, and each $X^{12}$ are independently one of a substituted or unsubstituted $C_1$ to $C_{20}$ alkyl group, a substituted or unsubstituted $C_1$ to $C_{20}$ alkoxy group, and a substituted or unsubstituted $C_1$ to $C_{20}$ ester group, and $R^3$ and $R^4$ are one of same and different, and each of $R^3$ and $R^4$ are independently one of hydrogen and a substituted or unsubstituted $C_1$ to $C_{20}$ alkyl group,

[Chemical Formula 12]

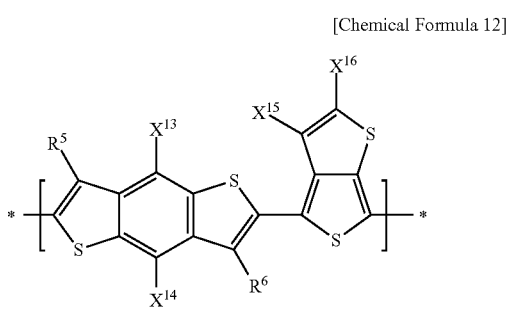

wherein, in Chemical Formula 12, $X^{13}$ and $X^{14}$ are one of same and different, and each of $X^{13}$ and $X^{14}$ are independently one of a substituted or unsubstituted $C_1$ to $C_{20}$ alkyl group, a substituted or unsubstituted $C_1$ to $C_{20}$ alkoxy group, a substituted or unsubstituted $C_1$ to $C_{20}$ ester group, and —$SR^{104}$, wherein $R^{104}$ is a substituted or unsubstituted $C_1$ to $C_{20}$ alkyl group, each $X^{15}$ are one of same and different in each repeating unit, and each $X^{15}$ are independently one of hydrogen and a halogen, each $X^{16}$ are one of same and different in each repeating unit, and each $X^{16}$ are independently one of a substituted or unsubstituted $C_1$ to $C_{20}$ alkyl group, a substituted or unsubstituted $C_1$ to $C_{20}$ alkoxy group, and a substituted or unsubstituted $C_1$ to $C_{20}$ ester group, and $R^5$ and $R^6$ are one of same and different, and each of $R^5$ and $R^6$ are independently one of hydrogen and a substituted or unsubstituted $C_1$ to $C_{20}$ alkyl group.

9. The electron-donating polymer of claim 8, wherein $X^5$ to $X^{10}$ are one of same and different, and each $X^5$ to $X^{10}$ are independently one of hydrogen and a substituted or unsubstituted $C_1$ to $C_{20}$ alkoxy group, and at least one of $X^5$ to $X^{10}$ is a substituted or unsubstituted $C_1$ to $C_{20}$ alkoxy group, $X^{13}$ and $X^{14}$ are one of same and different, and each $X^{13}$ and $X^{14}$ are independently a substituted or unsubstituted $C_1$ to $C_{20}$ alkoxy group, $R^3$ to $R^6$ are hydrogen, $X^{11}$ and $X^{15}$ are one of same and different, and each $X^{11}$ and $X^{15}$ are independently one of hydrogen and a halogen, and $X^{12}$ and $X^{16}$ are one of same and different, and each of $X^{12}$ and $X^{16}$ are independently a substituted or unsubstituted $C_1$ to $C_{20}$ ester group.

10. The electron-donating polymer of claim 1, wherein the repeating unit A has a bandgap ranging from about 1.1 eV to about 2.5 eV.

11. The electron-donating polymer of claim 1, wherein the repeating unit B has hole mobility ranging from about $1\times10^{-6}$ cm$^2$/V·s to about $9\times10^{-1}$ cm$^2$/V·s.

12. The electron-donating polymer of claim 1, wherein the electron-donating polymer comprises the repeating unit A and the repeating unit B at a mole ratio of about 1:10 to about 10:1.

13. The electron-donating polymer of claim 1, wherein the electron-donating polymer has a number average molecular weight of about 1000 to about 800,000.

14. The electron-donating polymer of claim 1, wherein the electron-donating polymer has a bandgap ranging from about 1.1 eV to about 2.5 eV.

15. The electron-donating polymer of claim 1, wherein the electron-donating polymer has hole mobility ranging from about $1\times10^{-6}$ cm$^2$/V·s to about $9\times10^{-1}$ cm$^2$/V·s.

16. An organic solar cell comprising:
an anode and a cathode configured to face each other; and
a photoactive layer between the anode and the cathode and comprising an electron donor comprising an electron-donating polymer and an electron acceptor,
wherein the electron donating polymer is the electron-donating polymer according to claim 1.

17. The electron donating polymer of claim 1, wherein one of the repeating unit A includes the repeating unit according to Chemical Formula 2 directly connected to the repeating unit according to Chemical Formula 3.

* * * * *